US011561152B2

(12) United States Patent
Kim et al.

(10) Patent No.: US 11,561,152 B2
(45) Date of Patent: Jan. 24, 2023

(54) APPARATUS FOR PREDICTING DEFORMATION OF BATTERY MODULE

(71) Applicant: LG Chem, Ltd., Seoul (KR)

(72) Inventors: Dong-Yeon Kim, Daejeon (KR); Jin-Hak Kong, Daejeon (KR); Yong-Seok Choi, Daejeon (KR); Sung-Won Seo, Daejeon (KR); Yoon-Koo Lee, Daejeon (KR); Dal-Mo Kang, Daejeon (KR); Jeong-O Mun, Daejeon (KR)

(73) Assignee: LG Energy Solution, Ltd.

( * ) Notice: Subject to any disclaimer, the term of this patent is extended or adjusted under 35 U.S.C. 154(b) by 359 days.

(21) Appl. No.: 16/314,707

(22) PCT Filed: Jan. 23, 2018

(86) PCT No.: PCT/KR2018/001013
§ 371 (c)(1),
(2) Date: Jan. 2, 2019

(87) PCT Pub. No.: WO2018/139834
PCT Pub. Date: Aug. 2, 2018

(65) Prior Publication Data
US 2020/0158596 A1    May 21, 2020

(30) Foreign Application Priority Data

Jan. 24, 2017  (KR) .......................... 10-2017-0011229

(51) Int. Cl.
*G01M 5/00*   (2006.01)
*H01M 10/42*  (2006.01)

(52) U.S. Cl.
CPC ..... *G01M 5/0041* (2013.01); *H01M 10/4285* (2013.01)

(58) Field of Classification Search
CPC .................. G01M 5/0041; H01M 10/4285
See application file for complete search history.

(56) References Cited

U.S. PATENT DOCUMENTS 6,177,799 B1    1/2001  Martineau et al.
9,477,931 B2   10/2016  Park et al.
(Continued)

FOREIGN PATENT DOCUMENTS

CN    103502830 A    1/2014
CN    106165187 A   11/2016
(Continued)

OTHER PUBLICATIONS

Oh et al., Phenomenological force and swelling models for rechargeable lithium-ion battery cells, 2016, Journal of Power Sources, No. 310 pp. 118-129 (Year: 2016).*
(Continued)

*Primary Examiner* — Alexander Satanovsky
*Assistant Examiner* — Lyudmila Zaykova-Feldman
(74) *Attorney, Agent, or Firm* — Lerner, David, Littenberg, Krumholz & Mentlik, LLP

(57) ABSTRACT

An apparatus for predicting a degree of deformation of a battery module, caused by swelling of a secondary battery. The battery module includes at least one secondary battery in a module case. The apparatus includes a cell evaluation module configured to derive a relationship between a thickness change amount and a reaction force for a single secondary battery; a case evaluation module configured to derive a relationship between a load applied to the module case and a width change amount of the module case; and a prediction module configured to predict a deformation amount of the battery module by using the relationship between the thickness change amount and the reaction force of the secondary battery, derived by the cell evaluation
(Continued)

module, and the relationship between the load and the width change amount of the module case, derived by the case evaluation module.

13 Claims, 12 Drawing Sheets

(56) References Cited

U.S. PATENT DOCUMENTS

| | | | | |
|---|---|---|---|---|
| 2005/0031946 A1* | 2/2005 | Kruger | ............... | H01M 50/528 |
| | | | | 429/208 |
| 2006/0093899 A1* | 5/2006 | Jeon | ............... | H01M 50/20 |
| | | | | 429/153 |
| 2007/0207377 A1* | 9/2007 | Han | ............... | H01M 50/507 |
| | | | | 429/185 |
| 2013/0268466 A1* | 10/2013 | Baek | ............... | G01R 31/392 |
| | | | | 706/12 |
| 2014/0106193 A1* | 4/2014 | Kim | ............... | H01M 10/0413 |
| | | | | 429/246 |
| 2014/0178720 A1 | 6/2014 | Rentzsch et al. | | |
| 2015/0188198 A1* | 7/2015 | Bonhomme | ............... | B60L 50/64 |
| | | | | 429/61 |
| 2016/0064780 A1 | 3/2016 | Jarvis et al. | | |
| 2016/0164061 A1 | 6/2016 | Han et al. | | |
| 2016/0340669 A1* | 11/2016 | Chen | ............... | B01J 20/281 |
| 2017/0018820 A1 | 1/2017 | Fukuda et al. | | |
| 2017/0074634 A1* | 3/2017 | Yoon | ............... | G01B 11/06 |
| 2017/0170510 A1 | 6/2017 | Turon Teixidor et al. | | |
| 2017/0200986 A1 | 7/2017 | Fukuda et al. | | |
| 2019/0056456 A1* | 2/2019 | Fukuda | ............... | G01R 31/3648 |
| 2020/0251788 A1* | 8/2020 | Sood | ............... | B60L 3/12 |

FOREIGN PATENT DOCUMENTS

| | | |
|---|---|---|
| JP | 2005339929 A | 12/2005 |
| JP | 2008288168 A | 11/2008 |
| JP | 2009048949 A | 3/2009 |
| JP | 2010032492 A | 2/2010 |
| JP | 4581481 B2 * | 11/2010 |
| JP | 2012-059491 A | 3/2012 |
| JP | 2013-080634 A | 5/2013 |
| JP | 2013089340 A | 5/2013 |
| JP | 2013200977 A | 10/2013 |
| JP | 2013251085 A | 12/2013 |
| JP | 2014127341 A | 7/2014 |
| JP | 2015090970 A | 5/2015 |
| JP | 2015115313 A | 6/2015 |
| JP | 2016-004724 A | 1/2016 |
| JP | 2016-027537 A | 2/2016 |
| JP | 2016-515291 A | 5/2016 |
| KR | 1996-0027145 A | 7/1999 |
| KR | 20140137181 A | 12/2014 |
| KR | 20160063278 A | 6/2016 |
| KR | 20160064871 A | 6/2016 |
| KR | 20160078312 A | 7/2016 |
| KR | 2016-0098774 A | 8/2016 |

OTHER PUBLICATIONS

Espacenet English translation of JP4581481B2, downloaded from the Internet on Nov. 2, 2021 (Year:2010) (Year: 2010).*
Oh et al., Phenomenological force and swelling models for rechargeable lithium-ion battery cells,2016, Journal of PowerSources, No. 310pp.118-129 (Year:2016) (Year: 2016).*
Oh et al., "Phenomenological force and swelling models for rechargeable lithium-ion battery cells", Journal of Power Sources, 2016, 310 pp. 118-129 (Year: 2016).*
Espacenet English Translation of JP4581481B2, downloaded from the Internet on Nov. 2, 2021 (Year: 2010).*
Oh et al., "Phenomenological forcw and swelling models for rechargeable lithium-ion battery cells", Journal of Power Sources, 2016, 310 pp. 118-129 (Year: 2016).*
Search report from International Application No. PCT/KR2018/001013, dated Jul. 20, 2018.
Extended European Search Report including the Written Opinion for Application No. EP 18743976.5 dated Aug. 5, 2019, 9 pages.
Chinese Search Report for Application No. 201880003023.4 dated May 24, 2021, pp. 1-3.

* cited by examiner

APPARATUS FOR PREDICTING DEFORMATION OF BATTERY MODULE

CROSS-REFERENCE TO RELATED APPLICATIONS

The present application is a national phase entry under 35 U.S.C. § 371 of International Application No. PCT/KR2018/001013 filed Jan. 23, 2018, published in Korean, which claims priority from Korean Patent Application No. 10-2017-0011229 filed on Jan. 24, 2017 in the Republic of Korea, all of which are incorporated herein by reference.

TECHNICAL FIELD

The present disclosure relates to a technique of predicting deformation of a battery module, and more particularly, to an apparatus capable of effectively and accurately predicting the degree of deformation of a battery module, caused by swelling due to the use or degradation of a secondary battery.

BACKGROUND ART

Secondary batteries commercially available at the present include nickel-cadmium batteries, nickel-hydrogen batteries, nickel-zinc batteries, and lithium secondary batteries. Among them, lithium secondary batteries are spotlighted since they have almost no memory effect compared to nickel-based secondary batteries to ensure free charging and discharging, and also have very low self-discharge rate and high energy density.

The lithium secondary battery mainly uses lithium-based oxide and carbonaceous material as a positive electrode active material and a negative electrode active material, respectively. The lithium secondary battery includes an electrode assembly in which a positive electrode plate and a negative electrode plate respectively coated with a positive electrode active material and a negative electrode active material are disposed with a separator interposed therebetween, and an exterior, namely a battery case, for sealably accommodating the electrode assembly together with an electrolyte.

Generally, the lithium secondary battery may be classified as a can-type secondary battery in which an electrode assembly is embedded in a metal can, and a pouch-type secondary battery in which an electrode assembly is embedded in a pouch made of aluminum laminate sheet, depending on the shape of the exterior.

In recent years, secondary batteries are being widely used not only in small-sized devices such as portable electronic devices but also in medium-sized and large-sized devices such as vehicles and power storage devices. For such a battery pack, a large number of secondary batteries may be electrically connected to increase capacity and power. At this time, the pouch-type secondary battery is being more widely used due to advantages such as easy stacking and light weight.

The pouch-type secondary battery may be generally manufactured by injecting electrolyte in a state where an electrode assembly is accommodated in a pouch exterior, and then sealing the pouch exterior.

FIG. 1 is an exploded perspective view showing a general pouch-type secondary battery, and FIG. 2 shows the pouch-type secondary battery of FIG. 1 in an assembled state.

As shown in FIGS. 1 and 2, the pouch-type secondary battery C may include an electrode assembly 20 and a pouch exterior 30 accommodating the electrode assembly 20.

Here, the electrode assembly 20 basically has a positive electrode plate, a negative electrode plate, and a separator interposed therebetween, and may be accommodated in an inner space formed in the pouch exterior 30. At this time, the pouch exterior 30 may be formed of an upper pouch 31 and a lower pouch 32, and sealing portions may be provided at outer circumferences of the upper pouch 31 and the lower pouch 32 so that the sealing portions are adhered to each other to seal the inner space in which the electrode assembly 20 is accommodated.

Here, at least one positive electrode tab 21 and at least one negative electrode tab 22 may extend from the positive electrode plate and the negative electrode plate, respectively. The positive electrode tab 21 and the negative electrode tab 22 may be coupled to a plate-type electrode lead 10, namely a plate-type positive electrode lead 11 and a plate-type negative electrode lead 12, respectively. In addition, the positive electrode lead 11 and the negative electrode lead 12 may be partially exposed to the outside of the pouch exterior 30 to provide an electrode terminal for electrical connection to an external configuration of the secondary battery, namely another secondary battery or an exterior device.

The secondary battery may generate gas therein due to degradation or the like as repeating charging and discharging. Also, if gas is generated therein as described above, a swelling phenomenon in which the exterior material is at least partially inflated may occur since an internal pressure increases. In particular, in case of the pouch-type secondary battery, the exterior in a pouch form has weak structural rigidity in comparison to the can-type secondary battery, and thus the swelling phenomenon may occur more severely.

As described above, if the swelling phenomenon occurs at the secondary battery, the internal pressure of the battery increases and the volume increases, which may adversely affect the structural stability of the battery module. Moreover, the battery module often includes a plurality of secondary batteries. In particular, in case of a middle-sized or large-sized battery module used in a vehicle or an energy storage device (ESS), a large number of secondary batteries may be included and interconnected for high output or high capacity. At this time, although the volume of each secondary battery increases only slightly due to the swelling, the deformation amount of the entire battery module may be seriously increased since the increased volume of every secondary battery is accumulated. Thus, the volume expansion caused by swelling of each secondary battery can degrade the structural stability of the battery module as a whole.

In order to prevent degradation of the structural stability of the battery module, it is necessary to predict a deformation amount caused by swelling of the secondary battery and to reflect the predicted deformation amount on a battery module design.

DISCLOSURE

Technical Problem

Therefore, the present disclosure is directed to providing an apparatus capable of effectively and accurately predicting the degree of deformation of a battery module, caused by swelling of secondary batteries.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for predicting deformation of a battery module, caused by swelling of a secondary battery, the battery module having at least one secondary battery in a module case, the apparatus comprising: a cell evaluation module configured to derive a relationship between a thickness change amount and a reaction force for a single secondary battery; a case evaluation module configured to derive a relationship between a load applied to the module case and a width change amount of the module case; and a prediction module configured to predict a deformation amount of the battery module by using the relationship between the thickness change amount and the reaction force of the secondary battery, derived by the cell evaluation module, and the relationship between the load and the width change amount of the module case, derived by the case evaluation module.

Here, the cell evaluation module may derive the relationship between the thickness change amount and the reaction force in a singular curve form.

In addition, the case evaluation module may derive the relationship between the load and the width change amount of the module case in a singular curve form.

In addition, the prediction module may check an intersecting point of the singular curve derived by the cell evaluation module and the singular curve derived by the case evaluation module, and predict a deformation amount of the battery module by using the checked intersecting point.

In addition, the battery module may include a plurality of secondary batteries, and the prediction module may convert the relationship between the thickness change amount and the reaction force for a single secondary battery, derived by the cell evaluation module, into a relationship between the thickness change amount and the reaction force for all secondary batteries included in the battery module, and predict a deformation amount of the battery module by using the converted relationship between the thickness change amount and the reaction force for all secondary batteries.

In addition, the secondary battery may be provided to stand vertically and arranged to be stacked in a lateral direction in the module case, and the case evaluation module may derive a relationship between a width change amount and a load applied to right and left sides of the module case.

In addition, the module case may include two end plates having a plate shape and respectively located at both ends of the secondary battery in a stacking direction, and the case evaluation module may derive a relationship between a width change amount and a load applied to the end plates.

In addition, the prediction module may predict the width change amount of the battery module and the load applied to the module case, as the deformation amount of the battery module.

In addition, the apparatus for predicting deformation of a battery module according to the present disclosure may further comprise a verification module configured to compare the deformation amount of the battery module, predicted by the prediction module, with a reference value stored in advance.

In another aspect of the present disclosure, there is provided a method for predicting deformation of a battery module, caused by swelling of a secondary battery, the battery module having at least one secondary battery in a module case, the method comprising: deriving a relationship between a thickness change amount and a reaction force for a single secondary battery; deriving a relationship between a load applied to the module case and a width change amount of the module case; and predicting a deformation amount of the battery module by using the relationship between the thickness change amount and the reaction force of the secondary battery, and the relationship between the load and the width change amount of the module case.

Here, the relationship between the thickness change amount and the reaction force may be derived in a singular curve form.

In addition, the relationship between the load and the width change amount of the module case may be derived in a singular curve form.

In addition, an intersecting point of the relationship between the thickness change amount and the reaction force and the relationship between the load and the width change amount of the module case is checked, and a deformation amount of the battery module may be predicted by using the checked intersecting point.

In addition, the battery module may include a plurality of secondary batteries, and the relationship between the thickness change amount and the reaction force for a single secondary battery may be converted into a relationship between the thickness change amount and the reaction force for all secondary batteries included in the battery module, and a deformation amount of the battery module may be predicted by using the converted relationship between the thickness change amount and the reaction force for all secondary batteries.

In addition, the secondary battery may be provided to stand vertically and arranged to be stacked in a lateral direction in the module case, and a relationship between a width change amount and a load applied to right and left sides of the module case may be derived.

In addition, the module case may include two end plates having a plate shape and respectively located at both ends of the secondary battery in a stacking direction, and a relationship between a width change amount and a load applied to the end plates may be derived.

In addition, the width change amount of the battery module and the load applied to the module case may be predicted as the deformation amount of the battery module.

In addition, the method for predicting deformation of a battery module according to the present disclosure may further comprise comparing the deformation amount of the battery module with a reference value stored in advance.

Advantageous Effects

According to an embodiment of the present disclosure, as a secondary battery is repeatedly charged and discharged, gas is generated in the secondary battery, and when a swelling phenomenon occurs so that the secondary battery is inflated, a resultant deformation amount of the battery module may be predicted more accurately, efficiently and quickly.

Thus, according to the embodiment of the present disclosure, a more stable battery module structure may be derived by reflecting the predicted deformation amount of the battery module on a battery module design.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

An apparatus for predicting deformation of a battery module according to the present disclosure may predict the deformation of a battery module, caused by swelling of a secondary battery, with respect to the battery module having at least one secondary battery in a module case. In particular, the apparatus for predicting deformation of a battery module according to the present disclosure may be more effectively applied to a battery module having a pouch-type secondary battery.

Figure 3:
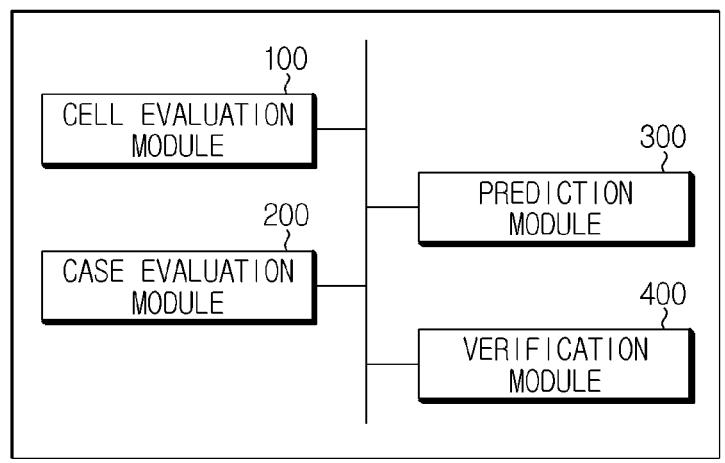
FIG. 3 is a block diagram schematically showing an apparatus for predicting deformation of a battery module according to an embodiment of the present disclosure.

FIG. 3 is a block diagram schematically showing an apparatus for predicting deformation of a battery module according to an embodiment of the present disclosure.

Referring to FIG. 3, an apparatus for predicting deformation of a battery module according to the present disclosure may include a cell evaluation module 100, a case evaluation module 200, and a prediction module 300.

The cell evaluation module 100 may derive the relationship between a thickness change amount and a reaction force for a single cell, namely one secondary battery. For example, if the battery module includes ten cells (ten secondary batteries), the cell evaluation module 100 may derive the relationship between the thickness change amount and the reaction force for one of the cells.

Here, the thickness change amount and reaction force of a cell may be a thickness change amount and a reaction force formed by swelling that occurs when gas is generated in the secondary battery due to charge and discharge of the secondary battery.

Figure 4:
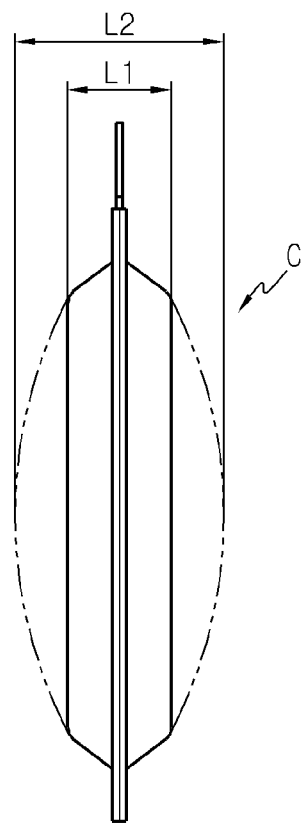
FIG. 4 is a diagram schematically showing a configuration for measuring a thickness change amount of a secondary battery according to an embodiment of the present disclosure.

FIG. 4 is a diagram schematically showing a configuration for measuring a thickness change amount of a secondary battery according to an embodiment of the present disclosure.

Referring to FIG. 4, the secondary battery may have a thickness as indicated by L1 just after being manufactured. Here, the thickness of the secondary battery may mean a maximum length of the battery in the direction in which two pouches are stacked one another. However, if the secondary battery is repeatedly charged and discharged, for example if the secondary battery is used up to the end of life (EOL), due to the gas generated in the secondary battery, a central portion of the secondary battery may swell considerably as indicated by a dotted line. Thus, the maximum thickness of the secondary battery at the EOL point may be increased to L2. In FIG. 4, the thickness change amount of the cell may be expressed as a value obtained by subtracting L1 from L2, namely 'L2−L1'.

Meanwhile, when a secondary battery is provided to the battery module, components surrounding the secondary battery such as a module case, an end plate and a cartridge may be present around the secondary battery. In this case, swelling of the secondary battery may be limited or allowed depending on the surrounding structures, and even though the secondary battery is allowed to swell, the degree of swelling may differ. Further, depending on the stiffness of the surrounding structure of the secondary battery, it may be determined to allow or limit swelling of the secondary battery or how much the secondary battery swells. In addition, if the swelling of the secondary battery is limited or allowed to some extent by the surrounding structure of the secondary battery, a reaction force may be applied to the secondary battery.

The cell evaluation module 100 may evaluate cell expansion characteristics with respect to the cell, for example how much the reaction force is generated for a given thickness change amount or how much the thickness change amount is generated for a given reaction force.

Moreover, when the battery module includes a plurality of secondary batteries, the plurality of secondary batteries may be all the same type. In other words, the plurality of secondary batteries included in the battery module may have the same material and shape, and thus the swelling characteristics of the secondary batteries may also be almost identical or similar. Thus, in this case, the cell evaluation module 100 may evaluate the swelling characteristic only for a single cell.

Preferably, the cell evaluation module 100 may derive the relationship between the thickness change amount and the reaction force for a secondary battery in a singular curve form.

Figure 5:
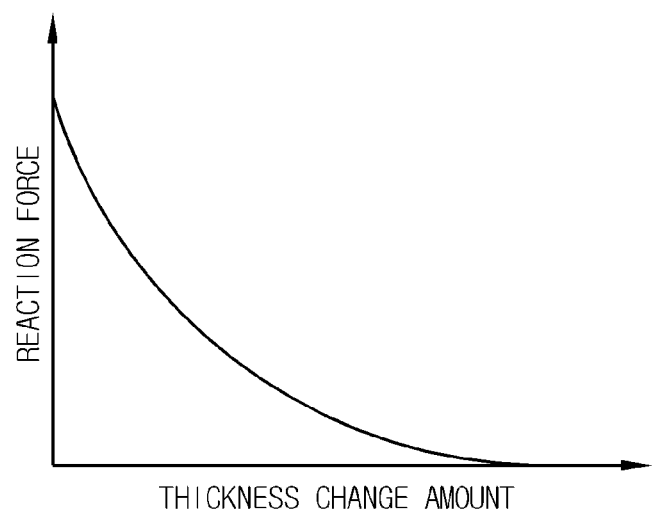
FIG. 5 is a graph showing a reaction force curve of the thickness change amount derived by a cell evaluation module according to an embodiment of the present disclosure.

FIG. 5 is a graph showing a reaction force curve of the thickness change amount derived by the cell evaluation module 100 according to an embodiment of the present disclosure. For example, it may be regarded that FIG. 5 shows the relationship between the thickness change amount and the reaction force at a cycle point that is already known as an EOL point of the battery.

Referring to FIG. 5, the cell evaluation module 100 may obtain a singular curve in the a coordinate system where the x-axis is a thickness change amount according to swelling of the secondary battery and the y-axis is a reaction force (load) generated by the swelling of the secondary battery. Here, the x-axis may be in the unit of length, for example 'mm', and the y-axis may be in the unit of force or weight, for example 'kgf'.

This curve may be obtained by varying the load applied to the secondary battery depending on the configuration of the battery module surrounding the secondary battery, for example the rigidity of the module case or the cartridge. For example, this curve may be obtained by measuring the reaction force according to a charging and discharging cycle and the load applied to the secondary battery according to the charging and discharging cycle as changing the rigidity of the module case or the cartridge surrounding the secondary battery to 0, 50 kgf, 100 kgf, 200 kgf, 10000 kgf, and the like.

Meanwhile, a module case may be generally provided to the battery module to accommodate at least one secondary battery.

Figure 6:
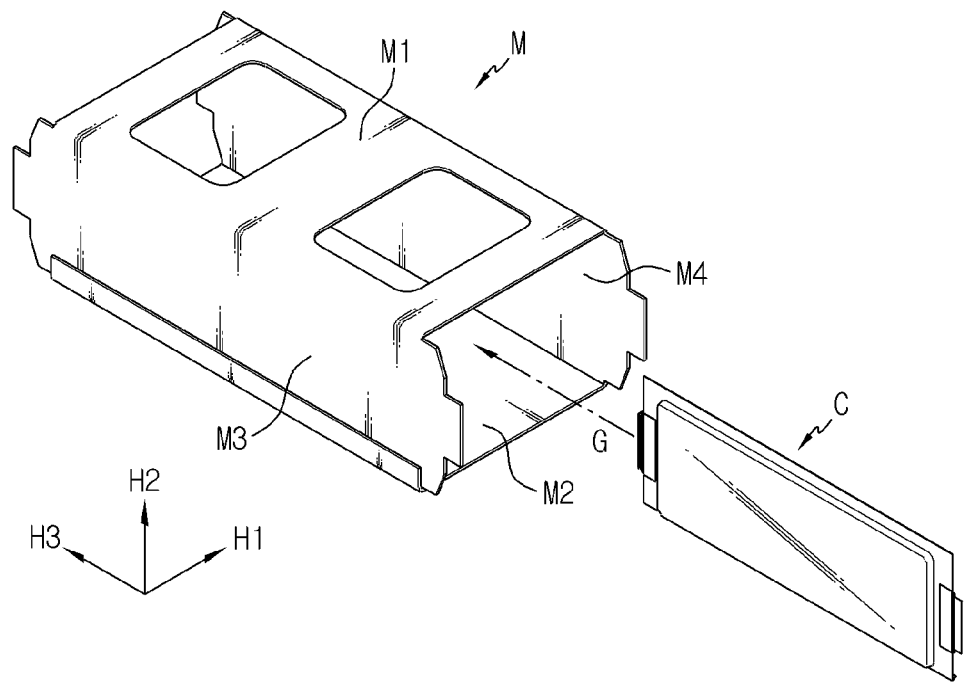
FIG. 6 is a perspective view schematically showing an example of a module case provided at the battery module.

FIG. 6 is a perspective view schematically showing an example of a module case provided at the battery module.

Referring to FIG. 6, a module case M may be provided to have an empty space thereon so that at least one secondary battery is accommodated therein. The module case is configured to have at least one open side so that the secondary battery may be inserted or withdrawn through the open side. The open side may be sealed by transforming the module case or coupling another cover thereto.

In more detail, seeing FIG. 6, the module case M is opened at a portion denoted by G, and a plurality of secondary batteries may be accommodated through the open portion. In other words, the secondary battery may be inserted into the inner space of the module case along the direction of an arrow G on the figure. However, even though FIG. 6 shows only one secondary battery for convenience of description, a plurality of secondary batteries may be inserted into the inner space of the module case.

In addition, the module case M may be configured so that upper, lower, left and right portions of the module case are at least partially sealed based on the space where the secondary battery is accommodated, in order to prevent the secondary battery from deviating in upper, lower, left and right directions. Here, the upper, lower, left and right directions are based on the case where the module case is observed in the direction indicated by G. In other words, in FIG. 6, the right direction means a H1 direction, and the left direction means a direction opposite to H1 In this configuration, the module case M may be regarded as having an upper case M1, a lower case M2, a left case M3 and a right case M4 as a unit case.

The case evaluation module 200 may derive the relationship between a load applied to the module case M and a deformation amount of the module case M. In particular, the case evaluation module 200 may derive the relationship between a load applied to the module case and a width change amount of the module case.

Here, the width of the module case may mean a length in the same direction as the thickness direction of the secondary battery. For example, in FIG. 6, the secondary battery may be accommodated in the module case in a standing form so that two broad surfaces are oriented toward left and right sides. At this time, the thickness direction of the secondary battery may be the H1 direction, namely a lateral direction. In addition, the width direction of the module case may also be referred to as the H1 direction, namely the lateral direction.

Further, the secondary batteries may be stacked so that broad surfaces thereof face each other inside the module case. For example, in FIG. 6, when a plurality of secondary batteries are accommodated inside the module case in a standing form, since broad surfaces are located at left and right sides, the plurality of secondary batteries may be stacked to each other in the lateral direction. Thus, the width of the module case may mean the length of the battery module in the stacking direction of the secondary batteries.

The width change amount may be an amount indicating how the length of the module case in the width direction changes by the load of the module case in the width direction.

Figure 7:
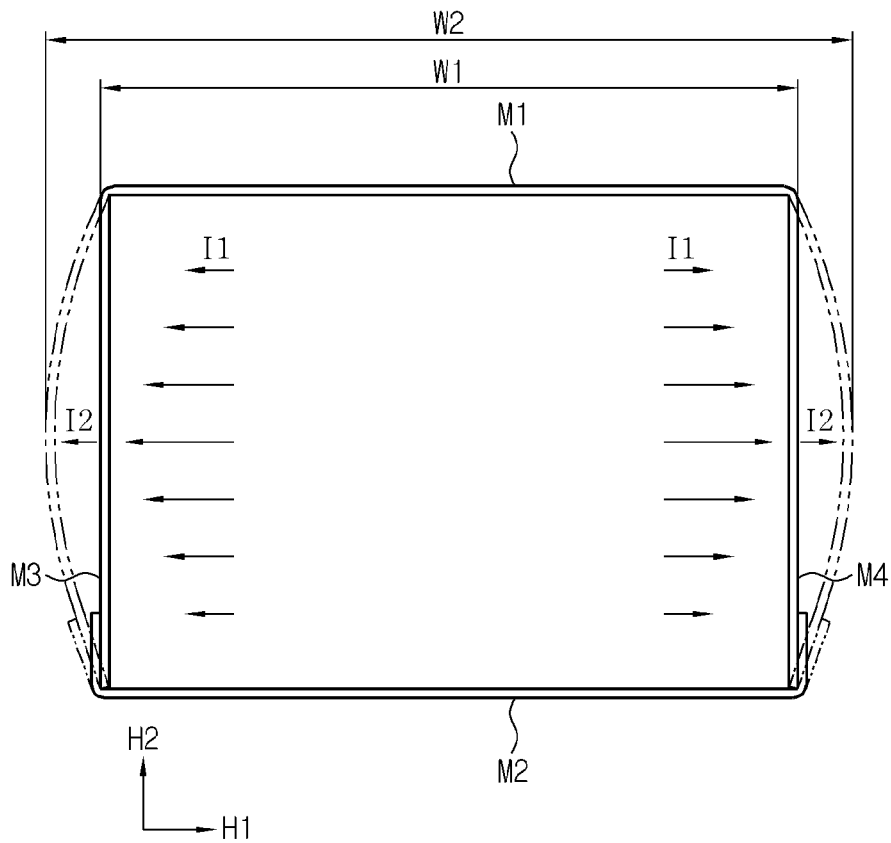
FIG. 7 is a diagram schematically showing a configuration for measuring a width change amount of the module case according to an embodiment of the present disclosure.

FIG. 7 is a diagram schematically showing a configuration for measuring a width change amount of the module case according to an embodiment of the present disclosure. FIG. 7 may be regarded as showing the module case of FIG. 6, observed at the front in the direction G.

Referring to FIG. 7, in a state where no force is applied, the width of the module case is as indicated by W1.

However, if a load (pressure) is applied in a direction from the inside of the module case toward the outside, namely in a direction indicated by an arrow I1, the left case M3 and the right case M4 of the module case may move along an arrow I2 and be curved outwards as indicated by a dotted line. In addition, the maximum width of the module case at this time is as indicated by W2.

The width change amount of a module case may be expressed as a value obtained by subtracting the original width W1 from the changed maximum width W2 of the module case, namely 'W2−W1'.

The case evaluation module 200 may measure the width change amount according to the load applied to the module case.

For example, while changing the pressure applied in the direction I1 in FIG. 7, the case evaluation module 200 may measure the resulting width change amount (W2−W1) of the module case, respectively.

In addition, when a load is applied to the module case, the case evaluation module 200 may allow a relatively large load to be applied to a central portion of the module case than upper and lower portions thereof.

For example, seeing FIG. 7, when a load is applied from the inside to the outside, a highest load may be applied at the center portion of the left case M3 and the right case M4 as indicated by the length of the arrow I1, and a relatively smaller load may be applied to the upper and lower portions.

When a swelling phenomenon occurs in the standing secondary battery, as shown in FIG. 4, deformation occurs relatively more at the center portion of the secondary battery, and thus the left and right cases may receive a greatest force at the center portion. Thus, the case evaluation module 200 may allow the greatest force to be transmitted to the center portion of the left case M3 and the right case M4 so that this situation may be reflected well.

Preferably, the case evaluation module 200 may derive the relationship between the load and the width change amount of the module case in a singular curve form.

Figure 8:
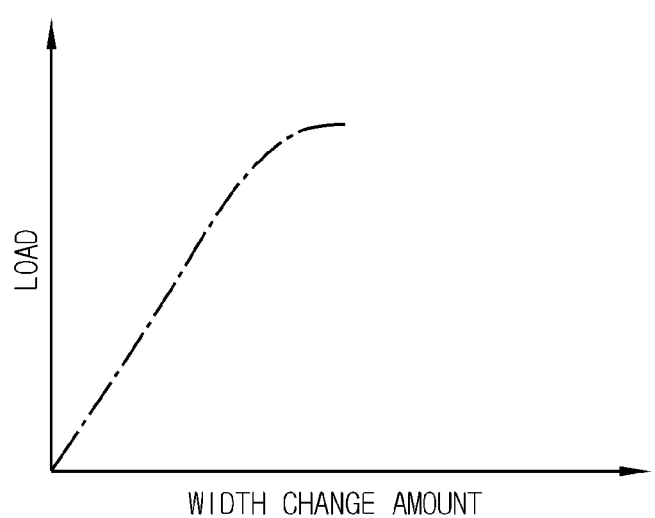
FIG. 8 is a curve graph showing the relationship between a deformation amount and a load of the module case, derived by the case evaluation module according to an embodiment of the present disclosure.

FIG. 8 is a curve graph showing the relationship between a deformation amount and a load of the module case, derived by the case evaluation module 200 according to an embodiment of the present disclosure.

Referring to FIG. 8, the case evaluation module 200 may obtain the singular curve in a coordinate system where the y-axis is a load applied to the module case, for example the left case M3 and the right case M4 of FIG. 7, and the x-axis is the width change amount of the module case. Here, the x-axis may be in the unit of length, for example 'cm', and the y-axis may be in the unit of force or weight, for example such as 'kgf'.

This curve may be obtained through a number of actual tests or simulations. For example, the curve shown in FIG. 8 may be derived by repeating the process of applying an actual force to the module case and actually measuring the resulting width change amount of the module case as described above, while changing the applied force.

If the secondary battery is repeatedly charged and discharged and gas is generated therein to increase the internal pressure, the secondary battery may swell in the direction in which two broad surfaces protrude. Thus, the deformation of the battery module may be intensively performed in the stacking direction of the secondary batteries, namely in the width direction of the battery module. Thus, the case evaluation module 200 may derive the relationship of the width change of the module case with respect to the load corresponding to the swelling of the secondary battery.

The prediction module 300 may predict the deformation amount of the battery module using the swelling characteristics of the battery derived by the cell evaluation module 100 and the deformation characteristics of the module case derived by the case evaluation module 200. In other words, the prediction module 300 may predict the deformation amount of the battery module by using the relationship between the thickness change amount and the reaction force of the battery derived by the cell evaluation module 100 and the relationship between the load and the width change amount of the module case derived by the case evaluation module 200.

Thus, according to the present disclosure, when a battery module is designed, it is possible to reflect the predicted deformation amount of the battery module. In particular, according to an embodiment of the present disclosure, the deformation amount of the battery module may be predicted at the time when the swelling of the secondary battery becomes maximum, for example at the EOL point when the life of the secondary battery ends, and this may be reflected in designing the module. Thus, according to the present disclosure, the battery module optimized for swelling caused by degradation of the secondary battery or the like may be designed, and thus a battery module structure stable for swelling may be derived.

In particular, the prediction module 300 may predict the width change amount of the battery module and the load applied to the module case as the deformation amount of the battery module.

For example, in the configuration shown in FIG. 7, the prediction module 300 may predict the value of W2−W1, which is the width change amount. Thus, a designer of a battery module or a battery pack may design the configuration outside the battery module in consideration of the predicted width change amount. For example, various electrical parts such as a battery management system (BMS), fuses, relays or the like may be provided outside the battery module, and the battery module and electrical parts may be provided to an inner space of the pack case to configure the battery pack. At this time, the designer may determine the arrangement of electrical parts outside the battery module in consideration of the predicted width change amount of the battery module. The inner space between the pack case and the module case may be too narrow without considering the deformation of the battery module caused by swelling of the secondary battery, which may damage the electric parts located between them or deform the pack case. However, according to the embodiment of the present invention, this problem may be prevented. In addition, when the inner space between the pack case and the module case is too wide in preparation for the deformation of the battery module, the battery pack may have an unnecessarily great volume. However, according to the embodiment of the present invention, this problem may be prevented.

In addition, since the prediction module 300 may predict the load applied to the module case, a designer of the battery module or the battery pack may design the module case to have rigidity suitable for the predicted load. For example, a designer may configure a module case by using a material that is capable of withstanding the load, in consideration of the load predicted by the prediction module 300. Alternatively, a designer may consider the load predicted by the prediction module 300 and then increase the thickness of the corresponding portion of the module case or attach a reinforcement plate thereto so as to withstand the load.

Preferably, the prediction module 300 may convert the relationship between the thickness change amount and the reaction force for a single secondary battery derived by the cell evaluation module 100 into as the relationship between the thickness change amount and the reaction force for all secondary batteries provided in the battery module. In addition, the prediction module 300 may predict the deformation amount of the battery module by using the relationship between the thickness change amount and the reaction force for all secondary batteries, converted as above.

For example, as shown in FIG. 5, the cell evaluation module 100 may derive the relationship between the thickness change amount and the reaction force for the secondary battery. However, if this relationship is for one secondary battery and the battery module includes a plurality of secondary batteries, the prediction module 300 may convert the relationship into the relationship between the thickness change amount and the reaction force for all secondary batteries included in the battery module.

Figure 9:
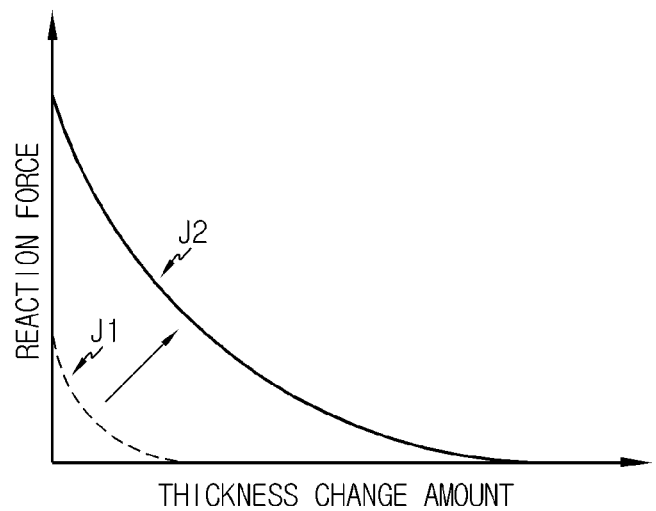
FIG. 9 is a graph schematically showing a configuration for converting the relationship between a thickness change amount and a reaction force for a single secondary battery according to an embodiment of the present disclosure to the relationship between a thickness change amount and a reaction force for all secondary batteries included in the battery module.

FIG. 9 is a graph schematically showing a configuration for converting the relationship between a thickness change amount and a reaction force for a single secondary battery according to an embodiment of the present disclosure to the relationship between a thickness change amount and a reaction force for all secondary batteries included in the battery module. Here, the x-axis may be in the unit of length, for example 'cm', and the y-axis may be in the unit of force or weight, for example 'kgf'.

Referring to FIG. 9, the relationship between the thickness change amount and the reaction force for one secondary battery derived by the cell evaluation module 100 is the same as the curve indicated by J1. However, if the battery module includes a plurality of secondary batteries, swelling may occur in several secondary batteries. Particularly, at the EOL point of the secondary batteries, swelling may occur in most secondary batteries. Thus, in this case, the reaction force and the thickness change amount caused by the swelling may increase as indicated by a curve J2.

Further, the secondary batteries in the battery module may be arranged so that their broad surfaces contact each other, and in this case, the swelling of the secondary batteries may be multiplied as much as the number of the secondary batteries included in the battery module. For example, if ten secondary batteries are accommodated in the module case in contact with each other, when the secondary batteries swell, the total width change amount of the battery module may be almost 10 times the thickness change amount of one secondary battery. In addition, if the swellings of the secondary batteries are added, the load applied to the module case and the reaction force applied to the secondary battery located at the outermost side may also be greatly increased.

By reflecting the above situation, the prediction module 300 may convert the relationship between the thickness change amount and the reaction force of the cell derived by the cell evaluation module 100 into the relationship between the thickness change amount, namely the width change amount, and the reaction force of the entire module.

Meanwhile, in this embodiment, even though it is described that the cell evaluation module 100 derives the relationship between a thickness change amount and a reaction force for a single secondary battery, the cell evaluation module 100 may also be configured to derive the relationship between the change amount and the reaction force for a plurality of secondary batteries. Further, the cell evaluation module 100 may directly derive the relationship between the thickness change amount and the reaction force for all secondary batteries included in the battery module.

According to this configuration of the present disclosure, the prediction module 300 may predict the deformation amount of the battery module by directly using the relationship between the thickness change amount and the reaction force derived by the cell evaluation module 100 without conversion.

Preferably, the prediction module 300 may check an intersecting point of the curve derived by the cell evaluation module 100 and the curve derived by the case evaluation module 200. In addition, the prediction module 300 may predict the deformation amount of the battery module by using the checked intersecting point. This will be described in more detail with reference to FIG. 10.

Figure 10:
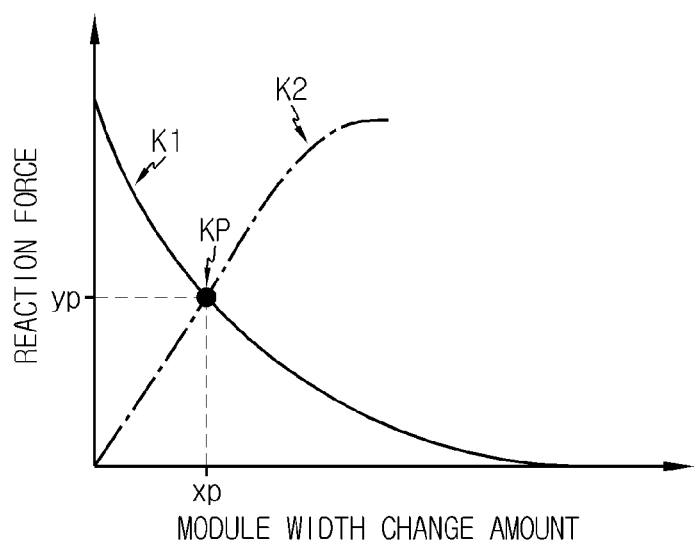
FIG. 10 is a graph schematically showing a configuration for predicting a deformation amount of a battery module according to an embodiment of the present disclosure.

FIG. 10 is a graph schematically showing a configuration for predicting a deformation amount of a battery module according to an embodiment of the present disclosure.

Referring to FIG. 10, the x-axis may represent the width change amount of the battery module, and the y-axis may represent the load or reaction force. Here, the x-axis may be in the unit of length, for example 'cm', and the y-axis may be in the unit of force or weight, for example 'kgf'.

The prediction module 300 may represent the relationship between the thickness change amount and the reaction force of the cell derived by the cell evaluation module 100 on the coordinate plane. Here, if the relationship derived by the cell evaluation module 100 is for one secondary battery and the battery module includes a plurality of secondary batteries, the prediction module 300 may convert the relationship into the relationship for all secondary batteries and then represent the converted relationship on the graph. For example, the prediction module 300 may convert the relationship between the thickness change amount and the reaction force for one secondary battery into the relationship between the thickness change amount (width change amount) and the reaction force for all secondary batteries included in the battery module, like the embodiment of FIG. 9 in which the J1 curve is converted to the J2 curve, and then display the converted relationship as a curve K1 of FIG. 10. In this case, the curve K1 of FIG. 10 may be regarded as adopting the curve J2 of FIG. 9.

In addition, the prediction module 300 may represent the relationship between the load and the width change amount of the module case derived by the case evaluation module 200 on the same coordinate plane. Also, the relationship between the load and the width change amount of the module case is identical to the curve indicated by K2 in FIG. 10. In other words, in FIG. 10, the curve K2 represents the relationship between the load and the width change amount of the module case derived by the case evaluation module 200 and is identical to, for example, the curve depicted in FIG. 8.

After that, the prediction module 300 may check an intersecting point Kp of the curve K1 and the curve K2. The intersecting point Kp may be regarded as a point where the force caused by the cell swelling and the resisting force due to the rigidity of the module case are in equilibrium. The prediction module 300 may predict the width change amount of the battery module or the resulting load (reaction force) at a certain cycle time, for example, at the end of life (EOL) point of the secondary battery, by using the intersecting point.

In other words, seeing FIG. 10, the prediction module 300 may check the coordinates (xp, yp) of the intersecting point Kp of two curves. Here, the x coordinate (xp) of the intersecting point may represent the width change amount of the battery module by the swelling of the secondary battery. For example, if the curve K1 is derived based on the EOL point, xp may be a predicted value of the width change amount of the battery module at the EOL point of the cell included in the battery module. For example, if xp is 15 cm, the prediction module 300 may predict that the width of the module will increase by 15 cm at the EOL point.

Also, the y coordinate (yp) of the intersecting point may be regarded as the load applied to the battery module caused by the swelling of the secondary battery. For example, if the curve K1 is derived based the EOL point, yp may be regarded as the pressure or force applied to the module case at the EOL point. For example, if yp is 10 kgf, the prediction module 300 may predict that a force of 10 kgf will be applied to the module case at the EOL point.

In particular, as described above, the secondary batteries may be stacked in a lateral direction inside the module case in a standing form. For example, as shown in FIG. 6, the secondary battery may be accommodated in the module case in a vertically standing form. In addition, a plurality of secondary batteries may be accommodated in the module case to face each other in a direction indicated by H1 in FIG. 6, namely in a lateral direction.

In this case, the case evaluation module 200 may derive the relationship between the applied load and the width change amount for the left and right side portions of the module case. For example, in FIGS. 6 and 7, the case evaluation module 200 may derive the relationship on how much the width of the secondary battery changes (W2−W1) according to the load applied to the left side portion M3 and the right side portion M4.

Meanwhile, the module case M of the battery module may be configured in various other forms, different from the former embodiment depicted in FIG. 6. For example, the module case may be configured to have two end plates.

Figure 11:
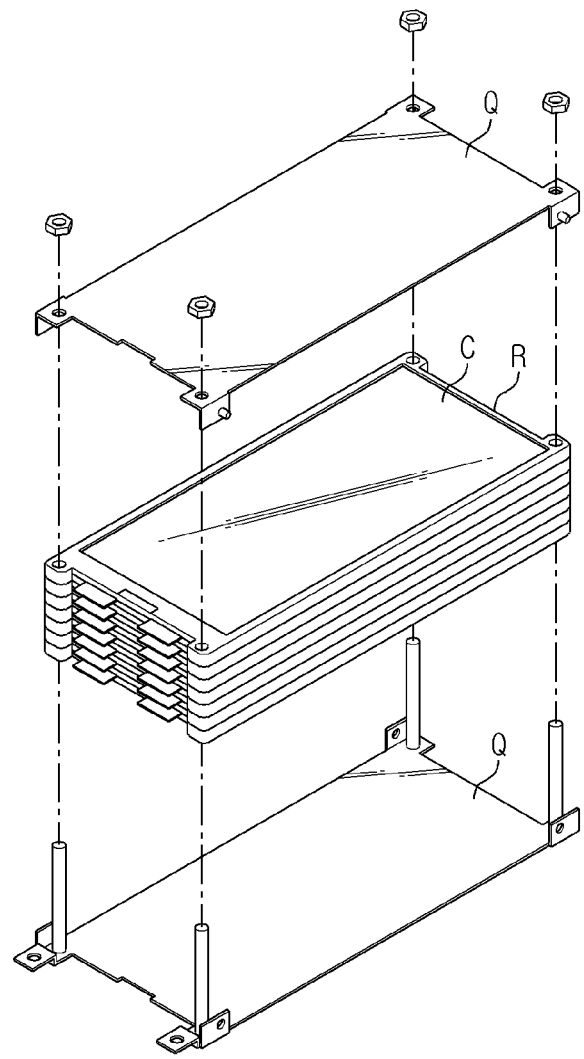
FIG. 11 is an exploded perspective view schematically showing a battery module having two end plates as the module case.

FIG. 11 is an exploded perspective view schematically showing a battery module having two end plates as the module case.

Referring to FIG. 11, the battery module may include a plurality of pouch-type secondary batteries C, and the secondary batteries may be stably stacked in a vertical direction in a horizontally lying form by means of stacking cartridges R.

In addition, an end plate Q formed in a plate shape may be provided to the upper and lower portions of the stacked structure of the secondary batteries C and the cartridges R, respectively. The end plate Q may provide mechanical support for the battery module and protect the secondary batteries from external shocks or the like at the top and bottom of the secondary batteries. For this, the end plate Q may be made of a metal material such as steel to improve rigidity.

For the battery module configured as above, the case evaluation module 200 may derive the relationship between the load applied to the end plates and the width change amount. In other words, the case evaluation module 200 may apply a load from the inside to the outside of the secondary battery and measure the degree of deformation of each end plate according to the applied load.

For example, in FIG. 11, the case evaluation module 200 may apply a load to the upper end plate and the lower end plate in the upper and lower directions, respectively, and measure the change of a maximum distance between the upper end plate and the lower end plate.

Preferably, the apparatus for predicting deformation of a battery module according to the present disclosure may further include a verification module 400 as shown in FIG. 3.

The verification module 400 may compare the deformation amount of the battery module predicted by the prediction module 300 with a previously stored reference value. Here, the deformation amount of the battery module may be the width change amount of the battery module and/or the load applied to the module case. For example, the verification module 400 may compare the width change amount of the battery module predicted by the prediction module 300 with a width reference value previously stored in a memory or the like. Also, the verification module 400 may compare the load applied to the battery module predicted by the prediction module 300 with a previously stored load reference value.

In addition, the verification module 400 may provide the comparison information to a user such as a designer, based on the comparison result.

For example, the verification module 400 may previously store a range of 10 cm as a reference value for the width change amount of the battery module. In addition, the verification module 400 may compare and determine whether the width change amount of the battery module predicted by the prediction module 300 is smaller or greater than 10 cm. If the width change amount of the battery module predicted by the prediction module 300 is 14 cm, the predicted width change amount of the battery module is dangerous, and thus the verification module 400 may provide warning information to a designer of the battery module or the battery pack. Then, the designer may redesign or reinforce the material or structure of the module case to reflect the width change amount of the battery module.

Meanwhile, in the apparatus for predicting deformation of a battery module according to the present disclosure, the cell evaluation module 100 may be configured in various forms to derive the relationship between a thickness change amount and a reaction force for a single secondary battery.

Figure 12:
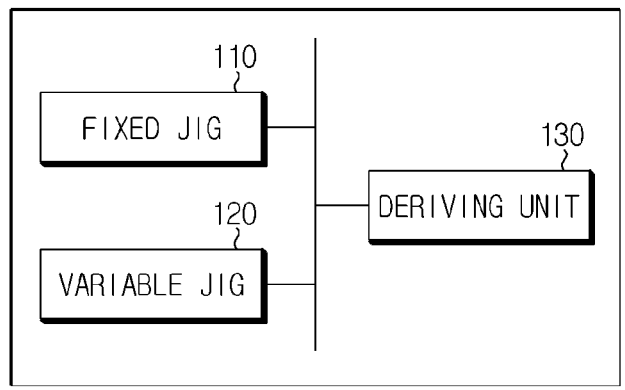
FIG. 12 is a block diagram schematically showing a cell evaluation module according to an embodiment of the present disclosure.

FIG. 12 is a block diagram schematically showing the cell evaluation module 100 according to an embodiment of the present disclosure.

Referring to FIG. 12, the cell evaluation module 100 according to the present disclosure may include a fixed jig 110, a variable jig 120 and a deriving unit 130.

The fixed jig 110 has a space for holding a secondary battery and may be configured to hold the secondary battery. In particular, the fixed jig 110 may be configured so that a pouch-type secondary battery is held in a horizontally lying-down form.

Figure 1:
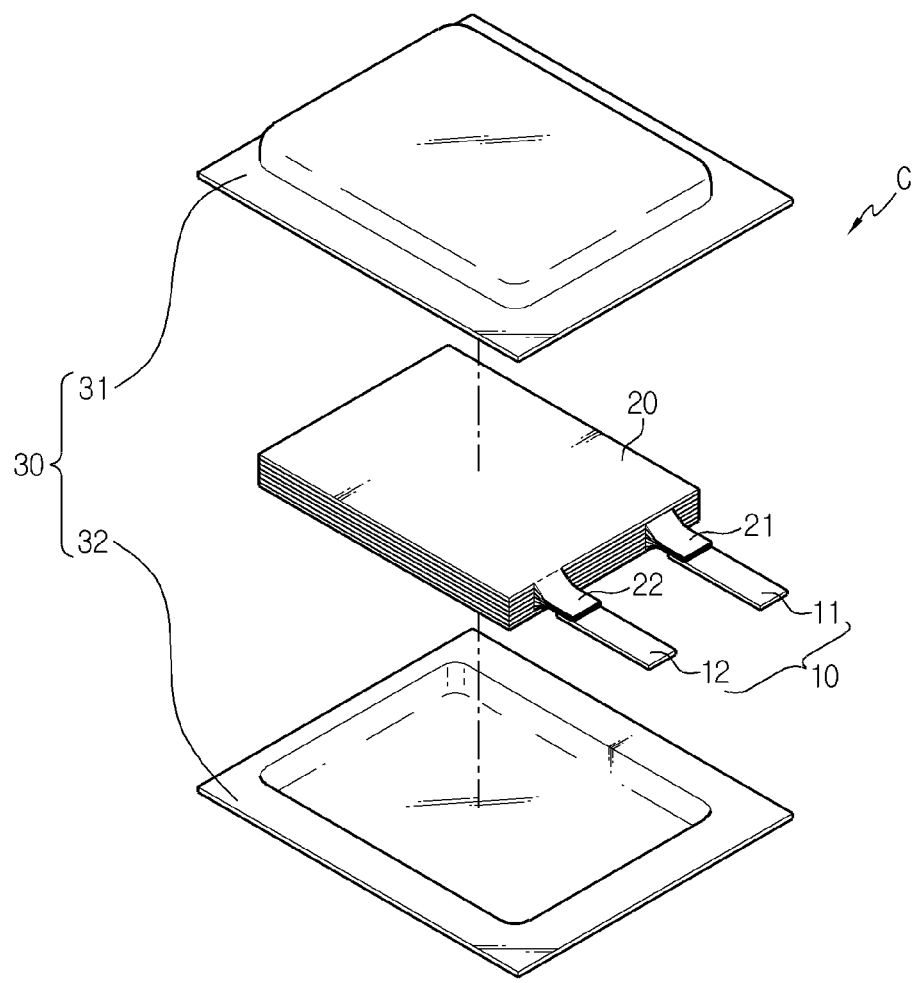
FIG. 1 is an exploded perspective view showing a general pouch-type secondary battery.
Figure 2:
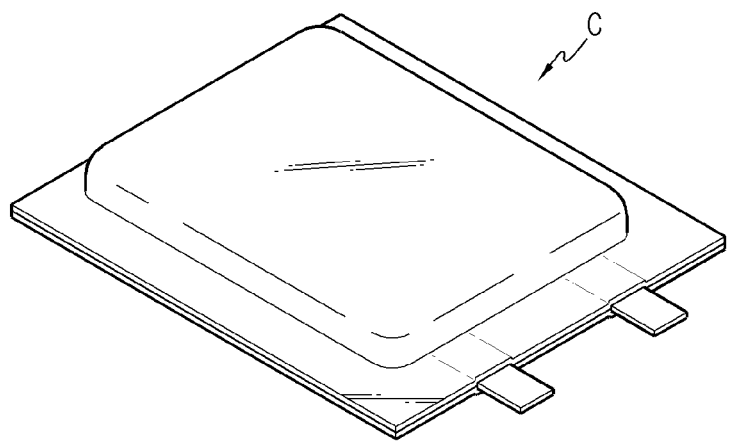
FIG. 2 shows the pouch-type secondary battery of FIG. 1 in an assembled state.

In addition, the fixed jig 110 may be configured to limit swelling of the retained secondary battery. In other words, even though an internal pressure of the secondary battery increases due to the generation of gas in the secondary battery, the fixed jig 110 may be configured not to allow the secondary battery to swell. In particular, the fixed jig 110 may limit the upward and downward swelling of the retained secondary battery. In other words, the fixed jig 110 may limit the secondary battery in a lying-down form not to swell in the surface direction (the upper and lower direction in FIG. 2).

Also, the fixed jig 110 may measure the change of the reaction force depending on the charging and discharging cycle of the retained secondary battery. As an example of the fixed jig 110 will be described in detail with reference to FIG. 13.

Figure 13:
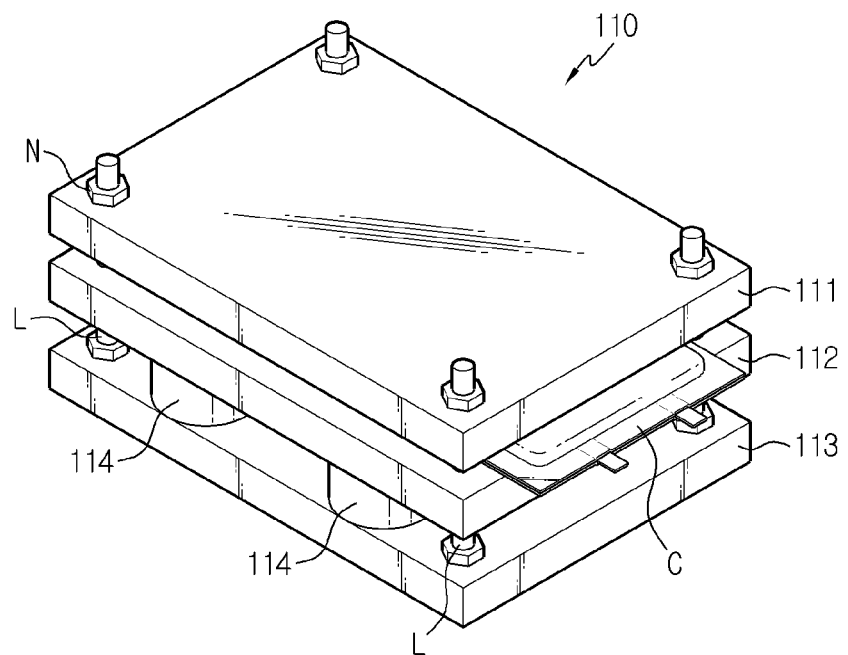
FIG. 13 is a perspective view schematically showing a fixed jig of the cell evaluation module according to an embodiment of the present disclosure.

FIG. 13 is a perspective view schematically showing the fixed jig 110 of the cell evaluation module 100 according to an embodiment of the present disclosure.

Referring to FIG. 13, the fixed jig 110 may include a fixed upper jig 111, a fixed lower jig 112, a fixed base member 113 and a fixed measurement member 114.

At the fixed jig 110, the fixed upper jig 111 may be located above the space in which the secondary battery C is held. In other words, when the secondary battery C is accommodated in the fixed jig 110, the fixed upper jig 111 may be located at the top of the secondary battery C. Moreover, the fixed upper jig 111 may be configured to contact a broad upper surface of the secondary battery in a face-to-face relationship.

In addition, the fixed upper jig 111 may be configured to be fixed at a position. In particular, the fixed upper jig 111 may be fixed in the vertical direction without moving in the vertical direction. Thus, the fixed upper jig 111 may maintain its position even though the secondary battery C swells due to charge and discharge of the secondary battery C. Due to the fixed position of the fixed upper jig 111, the fixed jig 110 may limit upward swelling of the secondary battery C.

The fixed lower jig 112 may be located below the fixed upper jig 111. The fixed lower jig 112 may be spaced apart from the fixed upper jig 111 by a predetermined distance to form a space for retaining the secondary battery, namely a space for accommodating the secondary battery. The secondary battery may be accommodated in the retention space between the fixed upper jig 111 and the fixed lower jig 112. In particular, a pouch-type secondary battery may be placed between the fixed upper jig 111 and the fixed lower jig 112 in a horizontally lying-down form in which two large surfaces are oriented upward and downward. Moreover, the fixed lower jig 112 may be configured to contact a broad bottom surface of the secondary battery in a face-to-face relationship.

The fixed base member 113 may be located below the fixed lower jig 112. In addition, the fixed base member 113 may be spaced apart from the fixed lower jig 112 by a predetermined distance.

Also, the fixed base member 113 may be coupled with the fixed upper jig 111 and the fixed lower jig 112. For example, as shown in FIG. 13, the fixed upper jig 111, the fixed lower jig 112 and the fixed base member 113 may be coupled to each other in such a manner that a plurality of fastening members such as bolts L penetrates therethrough.

In particular, the fixed base member 113 and the fixed upper jig 111 may be coupled so that a separation distance therebetween does not exceed a certain level. For example, in FIG. 13, the upper and lower ends of four bolts L are protruded at the top end of the fixed upper jig 111 and the bottom end of the fixed base member 113, respectively, and nuts N may be fastened to the protruding portions. In this case, the fixed upper jig 111 and the fixed base member 113 may not be further apart from each other based on the portion where the nuts N are fastened.

Also, the fixed lower jig 112 may be configured to be movable in the vertical direction with the bolts passing therethrough. For example, at least one hole may be formed in the fixed lower jig 112, and a bolt L passing through the fixed upper jig 111 and the fixed base member 113 may pass through the hole. In addition, the fixed lower jig 112 may be configured to be movable up and down along the bolt in a state where the bolt passes through the fixed lower jig 112. However, a fixed measurement member 114 may be positioned below the fixed lower jig 112 to prevent the fixed lower jig 112 from moving downward. Thus, even though an internal pressure of the secondary battery located at an upper side increases, the positions of the fixed upper jig 111 and the fixed lower jig 112 are fixed, and the increased internal pressure of the secondary battery may be transmitted to the fixed measurement member 114 through the fixed lower jig 112.

The fixed measurement member 114 may be interposed in the space between the fixed base member 113 and the fixed lower jig 112. Also, the fixed measurement member 114 may measure the reaction force according to the swelling of the secondary battery. As the secondary battery is charged and discharged, gas may be generated inside the secondary battery, and thus the internal pressure may increase. At this time, the fixed measurement member 114 may measure the load applied to the fixed lower jig 112 due to the increase of the internal pressure as the reaction force.

For example, if the secondary battery swells as the charge and discharge cycle of the secondary battery increases, the fixed lower jig 112 may move downward and press the fixed measurement member 114 located therebelow. Then, the fixed measurement member 114 may measure the reaction force according to the degree of pressurization and quantify the same. At this time, the fixed measurement member 114 may be configured not to change its thickness even though the fixed measurement member 114 is pressed. In addition, by this, even though the internal pressure of the secondary battery increases, the fixed lower jig 112 may not move substantially downward. Thus, in this case, the thickness of the secondary battery may not change within the fixed jig 110.

The fixed measurement member 114 may be implemented using a load cell. The load cell may be deformed, for example, compressed, by the reaction force applied to the fixed lower jig 112, and the load cell may quantify the degree of deformation to measure the applied pressure.

Figure 14:
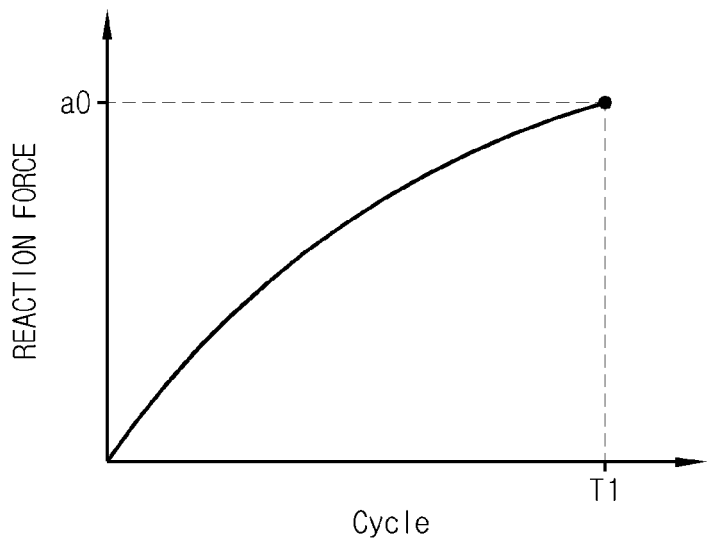
FIG. 14 shows an example of a graph showing a measurement result of a reaction force change amount, caused by the increase of cycles due to the fixed jig of the cell evaluation module according to an embodiment of the present disclosure.

FIG. 14 shows an example of a graph showing a measurement result of a reaction force change amount caused by the increase of cycles, using the fixed jig 110 of the cell evaluation module 100 according to an embodiment of the present disclosure. In FIG. 14, the x-axis represents a charging and discharging cycle and may be in the unit of 'number'. In addition, in FIG. 14, the y-axis represents a reaction force and may be in the unit of 'kgf'.

Referring to FIG. 14, the secondary battery may further swell as charging and discharging are repeated, namely as the charging and discharging cycle progresses. Then, the reaction force (load) measured by the fixed measurement member 114 of the fixed jig 110 may continue to increase. In particular, the fixed measurement member 114 of the fixed jig 110 may periodically or nonperiodically measure the reaction force according to swelling several times. In this case, the reaction force measured by the fixed measurement member 114 of the fixed jig 110 may be obtained in a graph form as shown in FIG. 14.

Meanwhile, the fixed upper jig 111, the fixed lower jig 112 and/or the fixed base member 113 may be formed in a flat plate shape as shown in the figure. According to this configuration of the present disclosure, the vertical size of the jig may be reduced, and the jig may stably and uniformly contact the secondary battery through a broad and flat surface. In particular, the cell evaluation module 100 according to the present disclosure may evaluate a pouch-type secondary battery, and the pouch-type secondary battery may be formed into a substantially rectangular flat shape with two large surfaces. At this time, two broad surfaces of the pouch-type secondary battery may contact the lower surface of the fixed upper jig 111 and the upper surface of the fixed lower jig 112, and in this case, a broader contact area may be formed.

The variable jig 120 may be configured to have a space for holding a secondary battery to hold the secondary battery therein. Moreover, the variable jig 120 may be configured so that a pouch-type secondary battery is held in a horizontally lying state.

In particular, the variable jig 120 may be configured to allow swelling of the retained secondary battery. Moreover, the variable jig 120 may be configured to allow upward swelling of the secondary battery. In other words, unlike the fixed jig 110, the variable jig 120 may be configured to allow the secondary battery to swell in a surface direction, particularly in an upward direction, when gas is generated in the secondary battery to increase the internal pressure.

The variable jig 120 may measure the reaction force and the thickness change amount according to the charging and discharging cycle of the retained secondary battery. In particular, since the variable jig 120 allows swelling of the secondary battery, it is possible to measure the thickness change amount of the secondary battery together with the reaction force by the secondary battery. An example of the variable jig 120 will be described in more detail with reference to FIG. 15.

Figure 15:
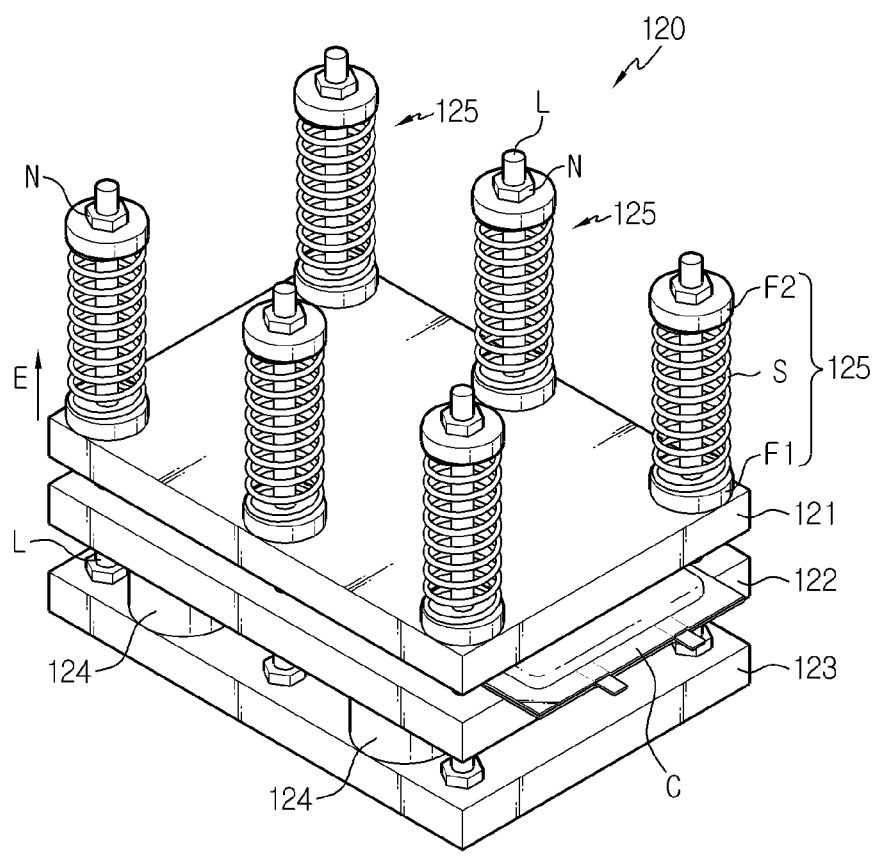
FIG. 15 is a perspective view schematically showing a variable jig of the cell evaluation module according to an embodiment of the present disclosure.

FIG. 15 is a perspective view schematically showing the variable jig 120 of the cell evaluation module 100 according to an embodiment of the present disclosure.

Referring to FIG. 15, the variable jig 120 may include a variable upper jig 121, a variable lower jig 122, a variable base member 123, a variable measurement member 124 and an elastic member 125.

At the variable jig 120, the variable upper jig 121 may be located above the space in which the secondary battery is held. In other words, when the secondary battery is accommodated in the variable jig 120, the variable upper jig 121 may be located at the top of the secondary battery.

Also, the variable upper jig 121 may be configured to be movable. In particular, the variable upper jig 121 may be configured to be movable in the vertical direction. For example, as indicated by an arrow E in FIG. 15, the variable upper jig 121 may move in an upper direction. Thus, when the secondary battery swells due to charge and discharge of the secondary battery to increase its volume, the variable upper jig 121 may move to the upper direction as indicated by the arrow E, depending on the degree of swelling. In other words, since the variable upper jig 121 is movable, the variable jig 120 may allow upward swelling of the secondary battery.

The variable lower jig 122 may be located below the variable upper jig 121. In addition, the variable lower jig 122 may be spaced apart from the variable upper jig 121 by a predetermined distance to form a space for holding the secondary battery. In addition, the secondary battery may be accommodated in the holding space between the variable upper jig 121 and the variable lower jig 122. In particular, a pouch-type secondary battery may be placed between the variable upper jig 121 and the variable lower jig 122 in a horizontally lying state so that two broad surfaces are oriented upward and downward.

The variable base member 123 may be located below the variable lower jig 122. The variable base member 123 may be configured to be spaced apart from the variable lower jig 122 by a predetermined distance.

Also, the variable base member 123 may be coupled with the variable upper jig 121 and the variable lower jig 122. For example, as shown in FIG. 15, the variable upper jig 121, the variable lower jig 122 and the variable base member 123 may be coupled to each other in such a manner that a plurality of fastening members such as bolts L penetrates therethrough.

In this configuration, the variable lower jig 122 may be configured to be movable in the vertical direction in a state where the bolts L penetrate therethrough. For example, six holes are formed in the variable lower jig 122, and bolts L passing through the variable upper jig 121 and the variable base member 123 may pass through the holes. At this time, if the secondary battery located at the above swells, the variable upper jig 121 may move in the upward direction, and the variable lower jig 122 may move in the downward direction. However, the hole may be formed at an edge of the variable lower jig, rather than at a center thereof. In this configuration of the present disclosure, it is possible to secure a large space for placing the secondary battery at the top of the variable lower jig and to prevent the space of placing the secondary battery from being restricted by the bolt penetrating through the hole.

The variable upper jig 121 and/or the variable lower jig 122 may be configured not to be easily bent by an external force, like a rigid body. In particular, the variable upper jig 121 and/or the variable lower jig 122 may be configured not to be bent by the swelling of the secondary battery or the pressing of the elastic member 125. In this case, the force caused by the swelling of the secondary battery or to the pressing of the elastic member 125 may be uniformly transferred to the variable upper jig 121 or the variable lower jig 122, thereby enabling more accurate measurement of the deformation amount and the reaction force.

The variable measurement member 124 may be interposed in the space between the variable base member 123 and the variable lower jig 122. Also, the variable measurement member 124 may measure the reaction force caused by the swelling of secondary battery C. In other words, if gas is generated in the secondary battery so that the secondary battery swells, the variable measurement member 124 may measure the magnitude of the pressing force caused by the swelling.

For example, if the secondary battery swells due to charging and discharging of the secondary battery, the variable lower jig 122 may tend to move downward and press the variable measurement member 124 located below. If so, the variable measurement member 124 may measure the reaction force according to the degree of pressurization and quantify the same. The variable measurement member 124 may be implemented using a load cell, like the fixed measurement member 114. Also, the variable measurement member 124 may be configured such that its thickness does not change. Thus, even though the secondary battery swells, the variable lower jig 122 may substantially not move downward.

In addition, the variable measurement member 124 may measure the thickness change amount according to the charging and discharging cycle of the secondary battery. In other words, if gas is generated inside the secondary battery to increase the volume, the variable measurement member 124 may measure the degree of thickness deformation due to the swelling of the secondary battery. For example, if the secondary battery swells so that the variable upper jig 121 moves upward and the lower jig 122 moves downward, the variable measurement member 124 may measure the thickness change amount of the secondary battery by measuring a distance between the variable upper jig 121 and the variable lower jig 122.

The elastic member 125 may be coupled to the variable upper jig 121. Also, the elastic member 125 may have a structure or material having elasticity. For example, the elastic member 125 may be formed with a metal spring. As another example, the elastic member 125 may be made of a rubber material.

The elastic member 125 may be configured to form a restoring force in a direction opposite to the movement of the variable upper jig 121. For example, in FIG. 15, if the variable upper jig 121 moves in the direction E, namely in the upward direction, the elastic energy of the elastic member 125 increases, and thus a restoring force to restore in the opposite direction, namely in the downward direction, may be formed.

According to this configuration of the present disclosure, when the variable jig 120 measures the reaction force and the thickness change amount according to the swelling of the secondary battery, the stiffness or elasticity of a structure surrounding the secondary battery may be similarly implemented. For example, the secondary battery may be surrounded by a case or cartridge, and the case or the cartridge may have a certain level of elasticity. In the configuration of the present disclosure, the case and the cartridge may be implemented using the elastic member 125, and thus in the actual battery module, the swelling characteristic of the secondary battery may be more accurately and easily figured out in consideration of the rigidity or the like of surrounding structures.

Preferably, the elastic member 125 may be located above the variable upper jig 121.

For example, as shown in FIG. 6, the elastic member 125 may be located at the top of the variable upper jig 121. In this case, the bottom end of the elastic member 125 may be configured to contact the variable upper jig 121. Thus, if the upper jig 121 moves upward due to swelling of the secondary battery, the bottom end of the elastic member 125 may move upward.

At this time, if the top end of the variable upper jig 121 is configured to be movable, when the variable upper jig 121 moves upward, the top end of the elastic member 125 may also move upward, and thus the elastic member 125 may not be appropriately compressed. Thus, the top end of the elastic member 125 is preferably fixed at a constant position.

In particular, the top end of the elastic member 125 may be coupled and fixed to the variable base member 123. If the top end of the elastic member 125 is coupled and fixed to the variable base member 123 as described above, the distance between the elastic member 125 and the variable base member 123 may be kept constant. Thus, even though the secondary battery swells so that the variable upper jig 121 moves upward and the bottom end of the elastic member 125 moves upward, the top end of the elastic member 125 may be fixed at a certain position. Thus, as the distance between the top end and the bottom end of the elastic member 125 becomes shorter, the elastic member 125 may be compressed to increase the elastic energy, and a force to restore in the opposite direction may be formed.

According to this configuration of the present disclosure, the top end of the elastic member 125 need not be fixed to a structure other than the variable jig 120. Thus, the variable jig 120 may be configured independently, which may allow free movement of the variable jig 120 and reduce the volume of the variable jig 120.

More preferably, the variable jig 120 may include at least one bolt. For example, as shown in FIG. 15, the variable jig 120 may include a plurality of bolts N elongating in a vertical direction. In addition, the bolts may be configured to sequentially pass through the variable base member 123, the variable lower jig 122, the variable upper jig 121 and the elastic member 125 from the lower side to the upper side.

According to this configuration of the present disclosure, various components (the variable base member 123, the variable lower jig 122, the variable upper jig 121 and the elastic member 125) included in the variable jig 120 may be coupled to each other by using a single element (bolt). Moreover, since the bolt is configured to penetrate through these components, respectively, an element for coupling them is substantially not exposed, and the overall volume may be reduced.

Further, the elastic member 125 may have a lower plate, a spring and an upper plate.

For example, in FIG. 15, the variable jig 120 may include six elastic members 125, and each elastic member 125 may have a lower plate F1, a spring S and an upper plate F2.

Here, the lower plate F1 may be configured in the form of a flat plate, and the lower surface of the lower plate F1 may contact the upper surface of the variable upper jig 121.

In addition, a bolt may penetrate through the lower plate.

Also, the spring S is placed on the upper portion of the lower plate and may be made of, for example, a metal material. The spring may be formed in a spiral shape so that a bolt penetrates through its hollow.

In addition, the upper plate F2 may be configured in the form of a flat plate and positioned at the upper portion of the spring. Moreover, the upper plate may be coupled and fixed to the bolt. For example, the upper plate may be coupled and fixed to the bolt in such a manner that the bolt passing through the variable base member 123, the variable lower jig 122, the variable upper jig 121, the lower plate and the spring penetrates through the upper plate to expose a top end of the bolt is exposed upwards, and a nut N is coupled to the exposed portion of the bolt.

According to this configuration of the present disclosure, the upper portion of the spring may be stably fixed by the upper plate. Also, in this case, when the variable upper jig 121 moves upward due to swelling of the secondary battery, the pressing force applied to the spring may be uniformly transmitted to the lower portion of the spring by the lower plate. Thus, it is possible to prevent irregular detachment or deformation of the spring by the pressing force when the secondary battery swells.

Figure 16:
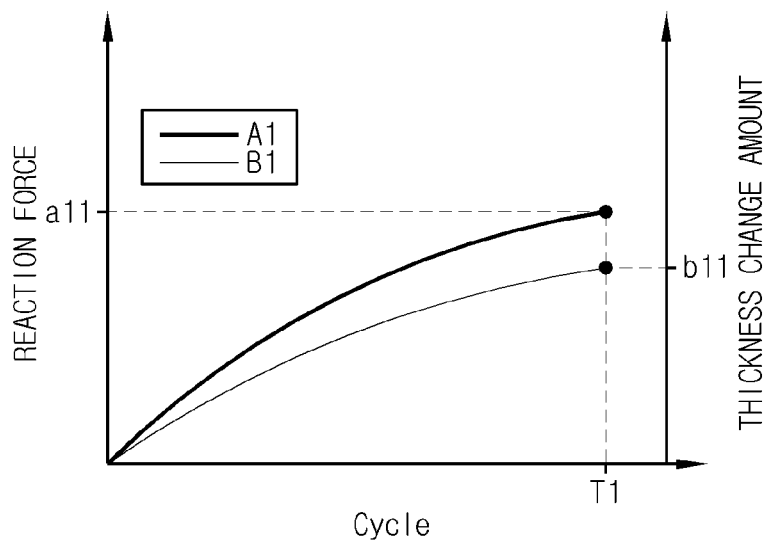
FIG. 16 shows an example of a graph showing a reaction force change amount and a thickness change amount caused by charging and discharging, measured by the variable jig of the cell evaluation module according to an embodiment of the present disclosure.

FIG. 16 shows an example of a graph showing a reaction force change amount and a thickness change amount caused by charging and discharging, measured by the variable jig 120 of the cell evaluation module 100 according to an embodiment of the present disclosure. In FIG. 16, the x-axis represents a charging and discharging cycle and may be in the unit of 'number'. In addition, the y-axis represents a reaction force or a thickness change amount and may be in the unit of 'kgf' or 'mm'.

Referring to FIG. 16, the reaction force measured by the variable measurement member 124 of variable jig 120 may also continue to increase as the secondary battery performs charging and discharging. In addition, the variable measurement member 124 of the variable jig 120 may also periodically or non-periodically measure the reaction force caused by the swelling several times so that the changing tendency of the reaction force may be obtained using a single line such as a curve as indicated by A1 in FIG. 16.

Also, at the variable jig 120, the secondary battery may swell as gas is generated therein due to repeated charging and discharging. Thus, the thickness of the secondary battery may gradually increase as the charging and discharging cycle increases. For this reason, the deformation amount, namely the thickness change amount, of the secondary battery measured by the variable jig 120 may be expressed with a curve gradually increasing with time, as indicated by A2 in FIG. 16.

The deriving unit 130 may derive the relationship between the thickness change amount and the reaction force of the secondary battery by using the reaction force measured by the fixed jig 110 and the reaction force and the thickness change amount measured by the variable jig 120.

For example, the deriving unit 130 may derive the relationship between the thickness change amount and the reaction force of the secondary battery by using a reaction force at a predetermined time point in the reaction force measured by the fixed jig 110 and a reaction force and a the thickness change amount at a predetermined time point in the reaction force and the thickness change amount measured by the variable jig 120.

Preferably, the deriving unit 130 may derive the relationship between the thickness change amount and the reaction force of the secondary battery based on the same charging and discharging cycle point. In other words, the deriving unit 130 may derive the relationship between the thickness change amount and the reaction force of the secondary battery by using the reaction force measured by the fixed jig 110 and the reaction force and the thickness change amount measured by the variable jig 120 at the same charging and discharging cycle point.

For example, in the graph of FIG. 14, the deriving unit 130 may obtain a y coordinate (a0) at a time point T1 on the graph of the reaction force of the secondary battery obtained by the fixed jig 110. In addition, the y coordinate (a0) may be regarded as the reaction force of the secondary battery at T1.

In addition, in the graph of FIG. 16, the deriving unit 130 may obtain a y coordinate (a11) at the time point T1 on the graph A1 of the reaction force obtained by the variable jig 120. Also, the deriving unit 130 may obtain a y coordinate (b11) at the time point T1 on the graph B1 of the deformation amount of the secondary battery obtained by the variable jig 120.

The deriving unit 130 may derive the relationship between the thickness change amount and the reaction force of the secondary battery by using the reaction force and the deformation amount (the thickness change amount) obtained at a predetermined time by the fixed jig 110 and the variable jig 120.

Here, the deriving unit 130 may derive the relationship between the thickness change amount and the reaction force of the secondary battery based on a time point at which the reaction force measured by the fixed jig 110 is maximized.

For example, in the graph of FIG. 14, the time point at which the reaction force of the battery reaches maximum may be T1. Thus, if the cycle point T1 at which the reaction force of the battery becomes maximum by the fixed jig 110 is determined, the reaction force and the thickness change amount measured by the variable jig 120 may be extracted based on the time point T1.

In particular, the life span of the secondary battery may be roughly predicted or determined when the battery is manufactured. Thus, the time point for predicting the reaction force and the thickness change amount may be determined based on the predicted or predetermined life span.

For example, if the life span of a specific secondary battery is predicted to be 5000 cycles, the time point T1 may be set to 5000 cycles for the corresponding secondary battery in the graphs of FIGS. 14 and 16. Thus, in this case, the reaction force of the secondary battery by the fixed jig 110 and the reaction force and the thickness change amount of the secondary battery by the variable jig 120 at the time point of 5000 cycles may be extracted. The deriving unit 130 may derive a graph of the reaction force according to the thickness change amount of the secondary battery.

In particular, the deriving unit 130 may derive a graph on a coordinate plane in which the deformation amount, namely the thickness change amount, of the secondary battery is x-axis and the reaction force of the secondary battery is y-axis.

In this case, the deriving unit 130 may derive a graph of the deformation amount and the reaction force of the secondary battery by using the reaction force at a predetermined time point obtained by the fixed jig 110 and the reaction force and the deformation amount at a predetermined time point obtained by the variable jig 120.

Figure 17:
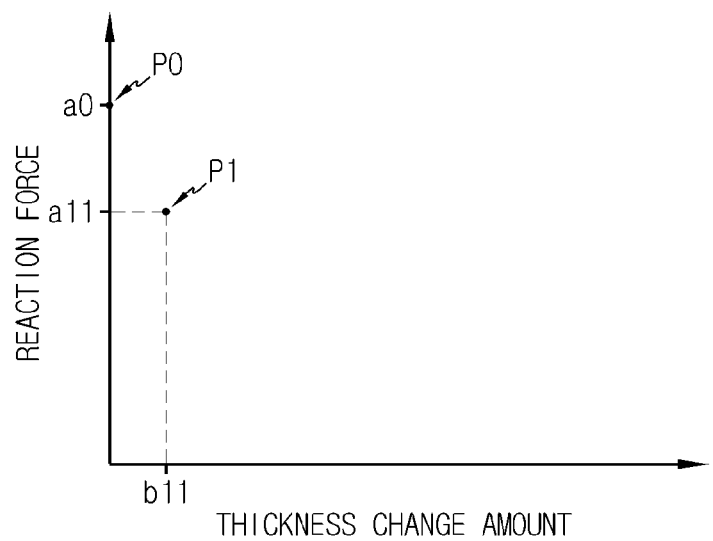
FIG. 17 is a diagram schematically showing a configuration for deriving the relationship between a deformation amount and a reaction force of a secondary battery by a deriving unit of the cell evaluation module according to an embodiment of the present disclosure.

FIG. 17 is a diagram schematically showing a configuration for deriving the relationship between a deformation amount and a reaction force of a secondary battery by the deriving unit 130 of the cell evaluation module 100 according to an embodiment of the present disclosure.

Referring to FIG. 17, the deriving unit 130 may set a coordinate plane where the x-axis represents the thickness change amount of the secondary battery and the y-axis represents the reaction force of the secondary battery. Here, the x-axis may be in the unit of length, for example 'mm', and the y-axis may be in the unit of force or weight, for example 'kgf'.

In addition, on the coordinate plane, the deriving unit 130 may represent the reaction force at the time point T1 obtained by the fixed jig 110 by using a single point. For example, in the graph of FIG. 14, a0 that is the reaction force at the time point T1 may become a y coordinate. Also, since there is substantially no thickness change amount of the battery at the fixed jig 110, the x coordinate at this time may be 0 (zero). Thus, the deriving unit 130 may obtain a coordinate point P0 (0, a0) by the fixed jig 110. In other words, the deriving unit 130 may input the reaction force obtained by the fixed jig 110 on the coordinate plane of the deformation amount and the reaction force as a y-intercept.

Also, the deriving unit 130 may represent at least one point in the coordinate plane by using the deformation amount and the reaction force at the time point T1 obtained by the variable jig 120. For example, in the graph of FIG. 16, a single point P1 having a coordinate (b11, a11) may be obtained by setting b11 that is the thickness change amount (the deformation amount) at the time point T1 as an x coordinate and al1 that is the reaction force at the time point T1 as a y coordinate.

As described above, by using the two points (P0, P1) obtained by the fixed jig 110 and the variable jig 120, the deriving unit 130 may obtain a single line. In other words, the deriving unit 130 may obtain a single graph by connecting the points obtained by the fixed jig 110 and the variable jig 120 to each other.

In particular, the variable jig 120 may include an elastic member 125, and the elastic member 125 may be configured to be exchangeable.

For example, in FIG. 15, the variable upper jig 121 is coupled to the elastic member 125, and the variable upper jig 121 may be configured so that the elastic member 125 is exchangeable.

In this case, the variable jig 120 may be configured so that the elastic member 125 is exchanged with another kind of elastic member 125. In particular, the variable jig 120 may be configured so that the elastic member 125 is exchanged with an elastic member 125 having a different spring constant. For example, the variable upper jig 121 and the elastic member 125 included in the variable jig 120 may be configured to be detachable and fastenable by being coupled to each other with a hooking structure. Alternatively, the variable upper jig 121 and the elastic member 125 may be configured to be detachable and fastenable by being coupled to each other with a fitting structure. For example, an upper portion of the variable upper jig 121 may have an insertion groove formed in a size and shape corresponding to a lower outer shape of the elastic member 125, and a lower portion of the elastic member 125 may be inserted into the insertion groove.

Further, the elastic member 125 may be in the form of a spring made of metal and having a spiral shape. In this case, different kinds of elastic bodies having different spring constants may be coupled to the variable upper jig 121 as a substitution.

In particular, the elastic member 125 may be positioned at the top of the variable upper jig 121 and coupled to the variable upper jig 121. In this case, the elastic member 125 may be exchanged more easily.

In a configuration where the elastic member 125 is easily exchangeable, if the elastic members 125 having different spring constants are coupled to the variable jig 120, the variable jig 120 may measure the reaction force and the thickness change amount according to the charging and discharging cycle of the secondary battery, respectively for each case where each elastic member 125 is coupled.

Figure 18:
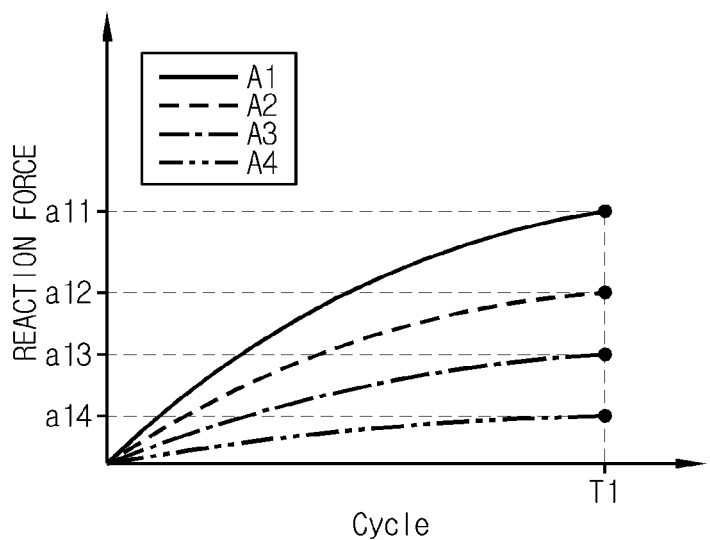
FIG. 18 is a graph showing a reaction force change according to the cycle in various cases where elastic members having different spring constants are coupled in the variable jig of the cell evaluation module according to an embodiment of the present disclosure.
Figure 19:
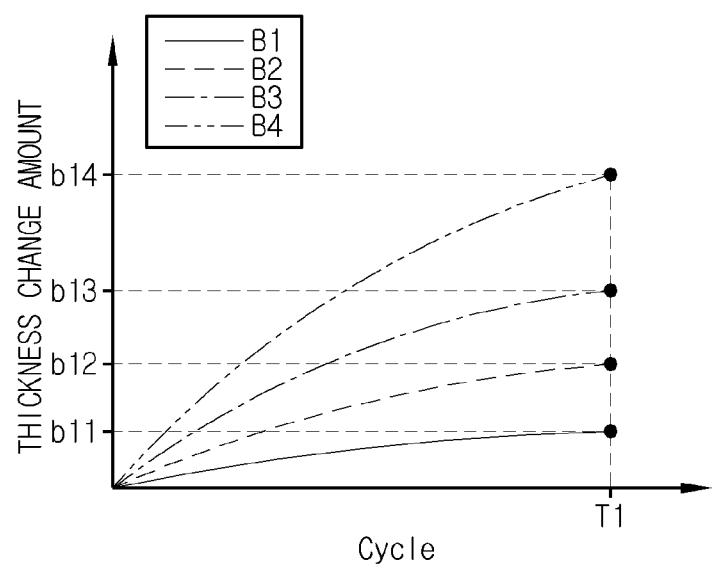
FIG. 19 is a graph showing a thickness change amount according to the cycle in various cases where elastic members having different spring constants are coupled in the variable jig of the cell evaluation module according to an embodiment of the present disclosure.

FIG. 18 is a graph showing a reaction force change according to the cycle in various cases where elastic members having different spring constants are coupled in the variable jig of the cell evaluation module 100 according to an embodiment of the present disclosure, and FIG. 19 is a graph showing a thickness change amount according to the cycle in various cases where elastic members 125 having different spring constants are coupled in the variable jig of the cell evaluation module 100 according to an embodiment of the present disclosure. In FIG. 18, the x-axis represents a charging and discharging cycle and may be in the unit of 'number'. In addition, the y-axis represents a reaction force and may be in the unit of 'kgf'. Moreover, in FIG. 19, the x-axis represents a charging and discharging cycle and may be in the unit of 'number'. In addition, the y-axis represents a thickness change amount and may be in the unit of 'mm'.

Referring to FIGS. 18 and 19, first, a reaction force graph A1 and a deformation amount graph B1 are shown in the same form as shown in FIG. 16. In addition, the reaction force of the graph A1 and the deformation amount of the graph B1 at the time point T1 may be a11 and b11, respectively. Thus, in a coordinate plane of the deformation amount and the reaction force, where the x-axis represents the deformation amount and the y-axis represents the reaction force, a coordinate point (b11, a11) may be obtained (P1), identical to the case of FIG. 17.

However, if an elastic member 125 having a lower spring constant is included in the variable jig 120 in comparison to the case where the graphs A1 and B1 are derived, the reaction force is lowered. Thus, as shown in FIG. 18, the reaction force graph may be obtained in the form of a graph A2 having a lower reaction force than the graph A1. In addition, as the spring constant is lowered, the thickness change amount of the battery may increase. Thus, as shown in FIG. 19, the deformation amount graph may be obtained in the form of a graph B2 having a higher thickness change amount in comparison to the graph B1. In this case, the thickness change amount and the reaction force at the time point T1 may be derived as b12 and a12. Thus, a coordinate point (b12, a12) may be obtained on the coordinate plane of the thickness change amount and the reaction force (P2).

Likewise, if an elastic member 125 having a lower spring constant is included in the variable jig 120 in comparison to the case where the graphs A2 and B2 are derived, as shown in the graphs A3 and B3 at FIGS. 18 and 19, the reaction force may become smaller and the thickness change amount may become larger. In this case, the thickness change amount value and the reaction force value at the time point T1 may be derived as b13 and a13. Thus, a coordinate point (b13, a13) may be obtained on the coordinate plane of the thickness change amount and the reaction force (P3).

In addition, if an elastic member 125 having a lower spring constant is included in the variable jig 120 in comparison to the case of the graphs A3 and B3, as shown in the graphs A4 and B4 at FIGS. 18 and 19, a graph in which the reaction force becomes smaller and the thickness change amount becomes larger may be obtained. In this case, the thickness change amount and the reaction force at the time point T1 may be derived as b14 and a14. Thus, a coordinate point (b14, a14) may be obtained on the coordinate plane of the thickness change amount and the reaction force (P4).

In addition, if a plurality of coordinate points are obtained by varying the spring constants as described above, the deriving unit 130 may obtain the graph of the thickness change amount and the reaction force by using the coordinate points. In other words, if the reaction force and the thickness change amount according to the charging and discharging cycle are measured by the variable jig 120 for every case where a plurality of elastic members 125 having different spring constants are coupled, the deriving unit 130 may derive the relationship between the thickness change amount and the reaction force of the secondary battery by using the measurement results.

Figure 20:
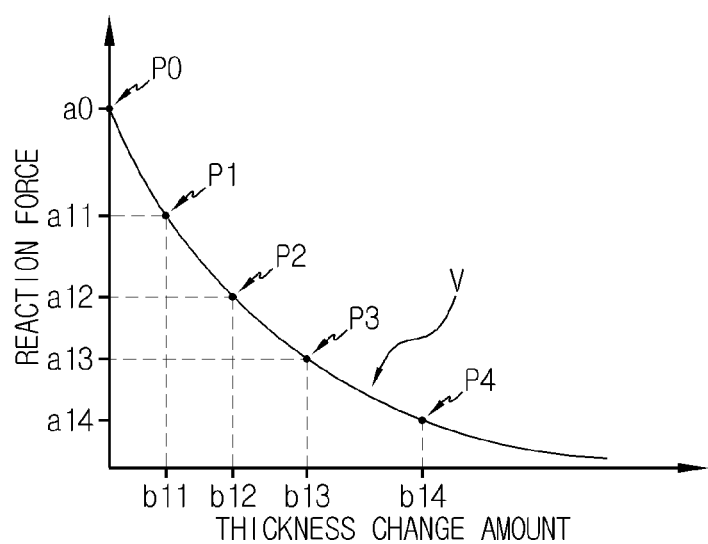
FIG. 20 is a graph showing the relationship between the deformation amount and the reaction force in various cases having different spring constants in the variable jig of the cell evaluation module according to an embodiment of the present disclosure.

FIG. 20 is a graph showing the relationship between the deformation amount and the reaction force in various cases having different spring constants in the variable jig of the cell evaluation module 100 according to an embodiment of the present disclosure. Here, the x-axis may be in the unit of length, for example 'mm', and the y-axis may be in the unit of force or weight, for example 'kgf'.

Referring to FIG. 20, the deriving unit 130 may represent one point (P0) on the y-axis by using the coordinate point (0, a0) obtained by the fixed jig 110 in the embodiment of FIG. 14, on the coordinate plane of the deformation amount and the reaction force. Also, the deriving unit 130 may display four coordinate points (P1, P2, P3, P4) obtained by the variable jig 120 while varying the spring constant in the embodiment of FIGS. 18 and 19, on the coordinate plane.

In addition, the deriving unit 130 may obtain a single line V by using the five points (P0 to P5) displayed as above. In particular, the deriving unit 130 may derive a single curve V by using the five points. In addition, the curve V derived as above may be a graph showing the relationship between the deformation amount and the reaction force of the secondary battery. For example, the graph of FIG. 11 may become the graph of FIG. 5 described above. Further, the deriving unit 130 may obtain a more precise curve when there are more coordinate points of cases having different spring constants.

In addition, in the apparatus for predicting deformation of a battery module according to the present disclosure, the cell evaluation module 100 may be configured in various forms to derive the relationship between a load applied to the module case and a width change amount of the module case.

The cell evaluation module 100 according to an embodiment of the present disclosure may include a load applying unit and a change amount measuring unit.

Here, the load applying unit may apply a load to the module case. Further, the load applying unit may apply a load from the inside to the outside of the module case. For example, the load applying unit may apply a load to the module case as indicated by the arrow I1 in FIG. 7.

In addition, the load applying unit may apply a load to the module case while changing the magnitude of the load. Also, the load applying unit may not apply the same load to the module case as a whole but apply a load with a deviation for each part. For example, as described above, the load applying unit may allow a more load to be applied to a central portion of the module case in comparison to outer portions such as an upper or lower portion. In this case, the swelling of the secondary battery, which occurs more frequently at the central portion, may be easily coped with.

The change amount measuring unit may measure the degree of change of the module case as the load is applied by the load applying unit. In particular, the load amount measuring unit may measure the amount of change of the overall width of the module case. For example, the change amount measuring unit may measure a difference between W2 and W1 in FIG. 7.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, when the terms indicating directions such as up, down, left, right, front and rear directions are used in the specification, it is obvious to those skilled in the art that these merely represent relative locations for convenience in explanation and may vary based on a location of an observer or an object.

REFERENCE SIGNS

100: cell evaluation module
110: fixed jig
111: fixed upper jig, 112: fixed lower jig, 113: fixed base member, 114: fixed measurement member
120: variable jig
121: variable upper jig, 122: variable lower jig, 123: variable base member, 124: variable measurement member, 125: elastic member
130: deriving unit
200: case evaluation module
300: prediction module
400: verification module

What is claimed is:

1. An apparatus for predicting deformation of a battery module, caused by swelling of a secondary battery, the apparatus comprising:
a cell evaluation module configured to derive a relationship between a thickness change amount and a reaction force for a single secondary battery, the single secondary battery including an electrode assembly and a battery case for accommodating the electrode assembly;
a case evaluation module configured to derive a relationship between a load applied to a module case and a width change amount of the module case, the module case configured to removably accommodate the single secondary battery; and
a prediction module configured to predict a deformation amount of the battery module by using the relationship between the thickness change amount and the reaction force of the secondary battery, derived by the cell evaluation module, and the relationship between the load and the width change amount of the module case, derived by the case evaluation module,
wherein the cell evaluation module derives the relationship between the thickness change amount and the reaction force in a singular curve form,
wherein the case evaluation module derives the relationship between the load and the width change amount of the module case in a singular curve form, and
wherein the prediction module checks an intersecting point of the singular curve derived by the cell evaluation module and the singular curve derived by the case evaluation module, and predicts a deformation amount of the battery module by using the checked intersecting point.

2. The apparatus for predicting deformation of a battery module according to claim 1, wherein the battery module is configured to removably accommodate a plurality of secondary batteries, and wherein the prediction module is configured to convert the relationship between the thickness change amount and the reaction force for the single secondary battery, derived by the cell evaluation module, into a relationship between the thickness change amount and the reaction force for the plurality of secondary batteries included in the battery module, and predict a deformation amount of the battery module accommodating the plurality of secondary batteries by using the converted relationship between the thickness change amount and the reaction force for the plurality of secondary batteries.

3. The apparatus for predicting deformation of a battery module according to claim 1, wherein the secondary battery is provided to stand vertically and arranged to be stacked in a lateral direction in the module case, and wherein the case evaluation module derives a relationship between a width change amount and a load applied to right and left sides of the module case.

4. The apparatus for predicting deformation of a battery module according to claim 1, wherein the module case includes two end plates having a plate shape and respectively located at both ends of the secondary battery in a stacking direction, and wherein the case evaluation module derives a relationship between a width change amount and a load applied to the end plates.

5. The apparatus for predicting deformation of a battery module according to claim 1, wherein the prediction module predicts the width change amount of the battery module and the load applied to the module case, as the deformation amount of the battery module.

6. The apparatus for predicting deformation of a battery module according to claim 1, further comprising: a verification module configured to compare the deformation amount of the battery module, predicted by the prediction module, with a reference value stored in advance.

7. A method for predicting deformation of a battery module, caused by swelling of a secondary battery, the method comprising:
- deriving a relationship between a thickness change amount and a reaction force for a single secondary battery, the single secondary battery including an electrode assembly and a battery case accommodating the electrode assembly;
- deriving a relationship between a load applied to the module case and a width change amount of the module case, the module case removably accommodating the single secondary battery; and
- predicting a deformation amount of the battery module by using the relationship between the thickness change amount and the reaction force of the secondary battery, and the relationship between the load and the width change amount of the module case,
- wherein the relationship between the thickness change amount and the reaction force is derived in a singular curve form,
- wherein the relationship between the load and the width change amount of the module case is derived in a singular curve form, and
- wherein an intersecting point of the relationship between the thickness change amount and the reaction force and the relationship between the load and the width change amount of the module case is checked, and a deformation amount of the battery module is predicted by using the checked intersecting point.

8. The method for predicting deformation of a battery module according to claim 7, wherein the battery module removably accommodates a plurality of secondary batteries, and wherein the relationship between the thickness change amount and the reaction force for the single secondary battery is converted into a relationship between the thickness change amount and the reaction force for the plurality of secondary batteries included in the battery module, and a deformation amount of the battery module accommodating the plurality of secondary batteries is predicted by using the converted relationship between the thickness change amount and the reaction force for the plurality of secondary batteries.

9. The method for predicting deformation of a battery module according to claim 7, wherein the secondary battery is provided to stand vertically and arranged to be stacked in a lateral direction in the module case, and wherein a relationship between a width change amount and a load applied to right and left sides of the module case is derived.

10. The method for predicting deformation of a battery module according to claim 7, wherein the module case includes two end plates having a plate shape and respectively located at both ends of the secondary battery in a stacking direction, and wherein a relationship between a width change amount and a load applied to the end plates is derived.

11. The method for predicting deformation of a battery module according to claim 7, wherein the width change amount of the battery module and the load applied to the module case is predicted as the deformation amount of the battery module.

12. The method for predicting deformation of a battery module according to claim 7, further comprising: comparing the deformation amount of the battery module with a reference value stored in advance.

13. The apparatus for predicting deformation of a battery module according to claim 1, wherein the prediction module is configured to predict a deformation amount of the battery module according to scaled corresponding values of the reaction force and the thickness change amount derived by the cell evaluation module that are, respectively, equal to corresponding values of the load applied to the module case and the width change amount derived by the case evaluation module.

* * * * *